(12) United States Patent
Lee et al.

(10) Patent No.: US 11,456,313 B2
(45) Date of Patent: Sep. 27, 2022

(54) THREE-DIMENSIONAL SEMICONDUCTOR MEMORY DEVICES WITH INCREASED INTEGRATION

(71) Applicant: Samsung Electronics Co., Ltd., Suwon-si (KR)

(72) Inventors: Kyunghwan Lee, Hwaseong-si (KR); Yongseok Kim, Suwon-si (KR); Kohji Kanamori, Seongnam-si (KR); Minhan Shin, Seoul (KR)

(73) Assignee: Samsung Electronics Co., Ltd.

( * ) Notice: Subject to any disclaimer, the term of this patent is extended or adjusted under 35 U.S.C. 154(b) by 47 days.

(21) Appl. No.: 16/710,198

(22) Filed: Dec. 11, 2019

(65) Prior Publication Data

US 2020/0381448 A1    Dec. 3, 2020

(30) Foreign Application Priority Data

May 28, 2019  (KR) .................. 10-2019-0062640

(51) Int. Cl.
| | |
|---|---|
| *H01L 27/11565* | (2017.01) |
| *H01L 27/11582* | (2017.01) |
| *H01L 27/11573* | (2017.01) |
| *H01L 27/1157* | (2017.01) |

(52) U.S. Cl.
CPC .... *H01L 27/11582* (2013.01); *H01L 27/1157* (2013.01); *H01L 27/11573* (2013.01)

(58) Field of Classification Search
CPC ......... H01L 27/11504; H01L 27/11519; H01L 27/11565; H01L 27/1158
See application file for complete search history.

(56) References Cited

U.S. PATENT DOCUMENTS

| | | | |
|---|---|---|---|
| 9,391,087 B2 | 7/2016 | Shibata et al. | |
| 9,431,420 B2 | 8/2016 | Hwang | |
| 9,666,532 B2 | 5/2017 | Chen | |
| 9,859,293 B2 | 1/2018 | Lee | |
| 9,899,399 B2 | 2/2018 | Ogawa et al. | |
| 10,128,264 B2 | 11/2018 | Lee | |
| 2016/0240547 A1* | 8/2016 | Tagami | H01L 27/11565 |
| 2017/0077114 A1 | 3/2017 | Yoshimori et al. | |
| 2018/0061852 A1* | 3/2018 | Minami | H01L 27/11582 |

(Continued)

*Primary Examiner* — Stephen M Bradley
*Assistant Examiner* — Gustavo G Ramallo
(74) *Attorney, Agent, or Firm* — Myers Bigel, P.A.

(57) ABSTRACT

Three-dimensional semiconductor memory devices are provided. A three-dimensional semiconductor memory device includes a stack structure that includes gate electrodes on a substrate. The three-dimensional semiconductor memory device includes a first vertical structure, a second vertical structure, a third vertical structure, and a fourth vertical structure that penetrate the stack structure and are sequentially arranged in a zigzag shape along a first direction. Moreover, the three-dimensional semiconductor memory device includes a first bit line that extends in the first direction. The first bit line vertically overlaps the second vertical structure and the fourth vertical structure. Centers of the second and fourth vertical structures are spaced apart at the same distance from the first bit line. The first vertical structure is spaced apart at a first distance from the first bit line. The third vertical structure is spaced apart at a second distance from the first bit line.

15 Claims, 17 Drawing Sheets

(56) References Cited

U.S. PATENT DOCUMENTS

| | | | | |
|---|---|---|---|---|
| 2018/0261616 A1* | 9/2018 | Cho | ............... | H01L 27/11573 |
| 2018/0358365 A1* | 12/2018 | Lee | ................. | H01L 27/1104 |
| 2019/0371811 A1* | 12/2019 | Oike | ................ | H01L 27/1156 |
| 2020/0303410 A1* | 9/2020 | Kanamori | ........... | G11C 16/08 |
| 2020/0335513 A1* | 10/2020 | Morozumi | ......... | G11C 5/063 |

* cited by examiner

THREE-DIMENSIONAL SEMICONDUCTOR MEMORY DEVICES WITH INCREASED INTEGRATION

CROSS-REFERENCE TO RELATED APPLICATION

This U.S. nonprovisional application claims priority under 35 U.S.C. § 119 to Korean Patent Application No. 10-2019-0062640 filed on May 28, 2019 in the Korean Intellectual Property Office, the entire contents of which are hereby incorporated by reference.

BACKGROUND

The present inventive concepts relate to a semiconductor memory device, and more particularly, to a three-dimensional semiconductor memory device.

Semiconductor devices have been highly integrated to meet high performance and low manufacturing cost demands by customers. Because integration of the semiconductor devices may be an important factor in determining product price, high integration is increasingly requested. Integration of typical two-dimensional or planar semiconductor devices is primarily determined by the area occupied by a unit memory cell, such that it may be greatly influenced by the level of technology for forming fine patterns. However, the extremely expensive processing equipment used to increase pattern fineness may set a practical limitation on increasing the integration of the two-dimensional or planar semiconductor devices.

To overcome such limitations, three-dimensional semiconductor memory devices having three-dimensionally arranged memory cells have been proposed. However, in order to mass produce three-dimensional semiconductor memory devices, it is desirable to develop new process technologies in such a manner that can provide a lower manufacturing cost per bit than two-dimensional semiconductor devices while maintaining or exceeding their level of reliability.

SUMMARY

Some example embodiments of the present inventive concepts provide a semiconductor memory device with increased reliability.

An object of the present inventive concepts is not limited to the mentioned above, and other objects which have not been mentioned above will be clearly understood to those skilled in the art from the following description.

According to some example embodiments of the present inventive concepts, a three-dimensional semiconductor memory device may include a stack structure that is on a substrate and that includes a plurality of gate electrodes on the substrate. The three-dimensional semiconductor memory device may include a first vertical structure, a second vertical structure, a third vertical structure, and a fourth vertical structure that penetrate the stack structure and are sequentially arranged in a zigzag shape along a first direction. Moreover, the three-dimensional semiconductor memory device may include a first bit line that extends in the first direction. The first bit line may vertically overlap the second vertical structure and the fourth vertical structure. Centers of the second and fourth vertical structures may be spaced apart at the same distance from the first bit line. The first vertical structure may be spaced apart at a first distance from the first bit line. The third vertical structure may be spaced apart at a second distance from the first bit line. The first distance may be greater than the second distance.

According to some example embodiments of the present inventive concepts, a three-dimensional semiconductor memory device may include a stack structure that includes a plurality of gate electrodes sequentially stacked on a substrate. The three-dimensional semiconductor memory device may include a first vertical structure, a second vertical structure, a third vertical structure, a fourth vertical structure, and a fifth vertical structure that penetrate the stack structure and are sequentially arranged in a zigzag shape along a first direction. Moreover, the three-dimensional semiconductor memory device may include a plurality of bit lines that extend in the first direction on the stack structure. A first minimum distance between the first vertical structure and the second vertical structure may be greater than a second minimum distance between the second vertical structure and the third vertical structure.

According to some example embodiments of the present inventive concepts, a three-dimensional semiconductor memory device may include a stack structure that is on a substrate and that includes a first string select line and a second string select line that are spaced apart in a first direction on the substrate. The three-dimensional semiconductor memory device may include a plurality of first vertical structures and a plurality of second vertical structures that penetrate the first string select line and the second string select line. The first vertical structures may be spaced apart in the first direction from the second vertical structures. The three-dimensional semiconductor memory device may include a plurality of third vertical structures that penetrate the first and second string select lines. The third vertical structures may be spaced apart at a first distance from a line that passes through centers of the first and second vertical structures. Moreover, the three-dimensional semiconductor memory device may include a first bit line that extends across the stack structure. The first bit line may connect one of the third vertical structures that penetrates the first string select line to one of the second vertical structures that penetrates the second string select line.

DETAILED DESCRIPTION

Figure 1:
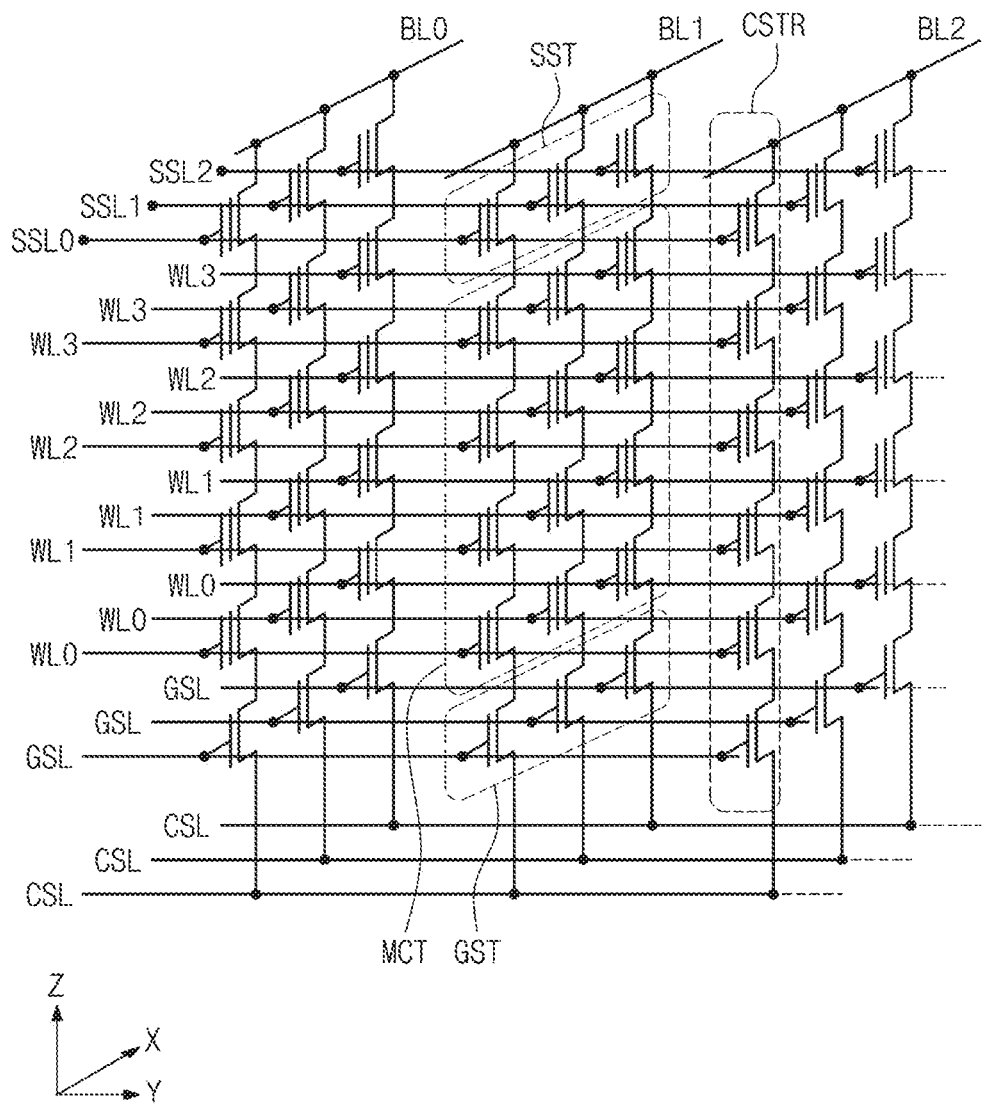
FIG. 1 illustrates a simplified circuit diagram showing a cell array of a three-dimensional semiconductor memory device according to some example embodiments of the present inventive concepts.

FIG. 1 illustrates a simplified circuit diagram showing a cell array of a three-dimensional semiconductor memory device according to some example embodiments of the present inventive concepts.

Referring to FIG. 1, a three-dimensional semiconductor memory device may include a common source line CSL, a plurality of bit lines BL0 to BL2, and a plurality of cell strings CSTR between the common source line CSL and the bit lines BL0 to BL2.

The bit lines BL0 to BL2 may be two-dimensionally arranged, and a plurality of cell strings CSTR may be connected in parallel to each of the bit lines BL0 to BL2. The cell strings CSTR may thus be two-dimensionally arranged either on the common source line CSL or on a substrate.

Each of the cell strings CSTR may include a ground select transistor GST connected to the common source line CSL, a string select transistor SST connected to one of the bit lines BL0 to BL2, and a plurality of memory cell transistors MCT disposed between the ground and string select transistors GST and SST. The ground select transistor GST, the string select transistor SST, and the memory cell transistors MCT may be connected in series. In addition, a ground select line GSL, a plurality of word lines WL0 to WL3, and a plurality of string select lines SSL0 to SSL2, which lines GSL, WL0 to WL3, SS0 to SSL2 are disposed between the common source line CSL and the bit lines BL0 to BL2, may be used as gate electrodes of the ground select transistor GST, the memory cell transistors MCT, and the string select transistor SST, respectively.

Figure 2:
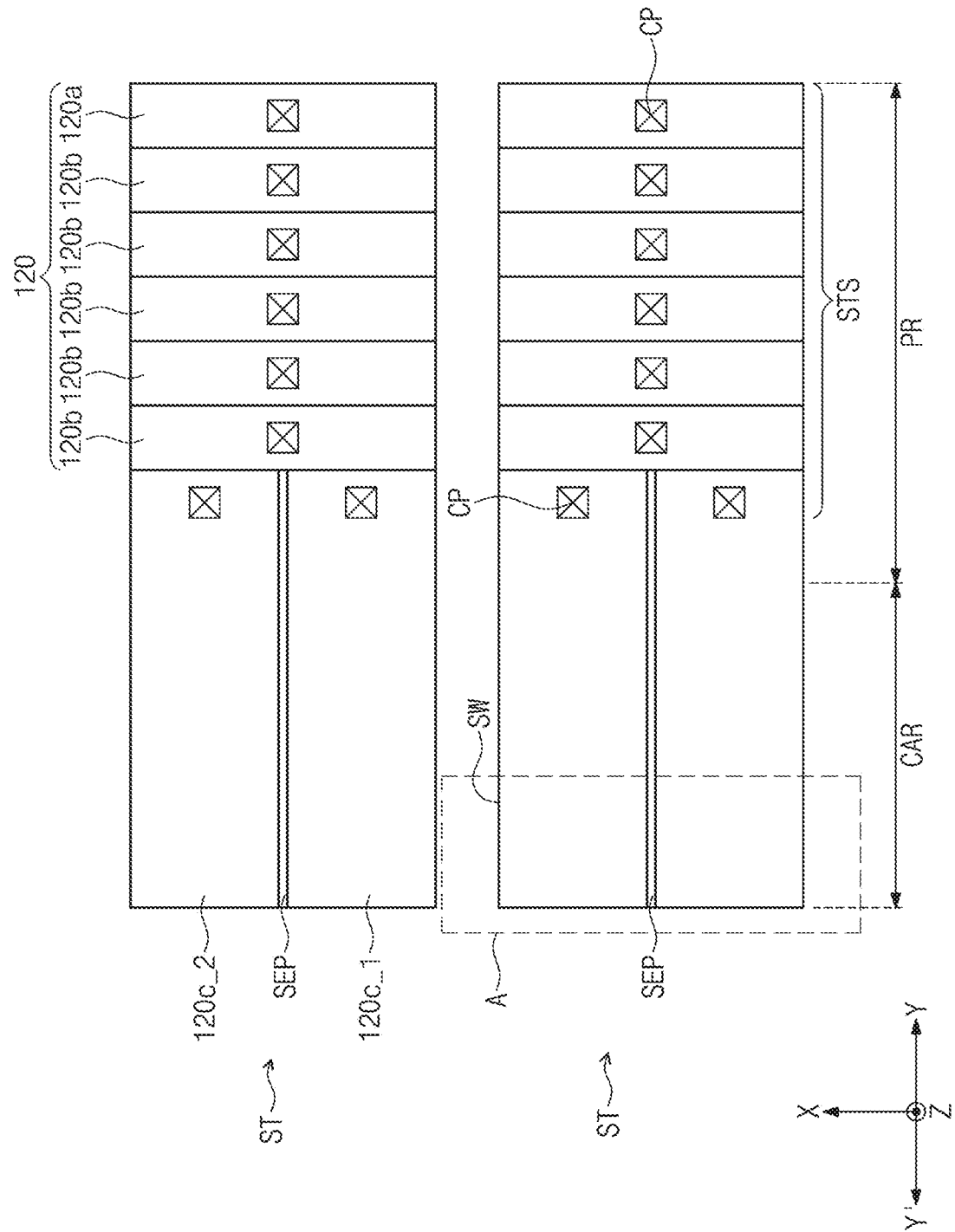
FIG. 2 illustrates a plan view showing a three-dimensional semiconductor memory device according to some example embodiments of the present inventive concepts.

FIG. 2 illustrates a plan view showing a three-dimensional semiconductor memory device according to some example embodiments of the present inventive concepts.

Figure 4:
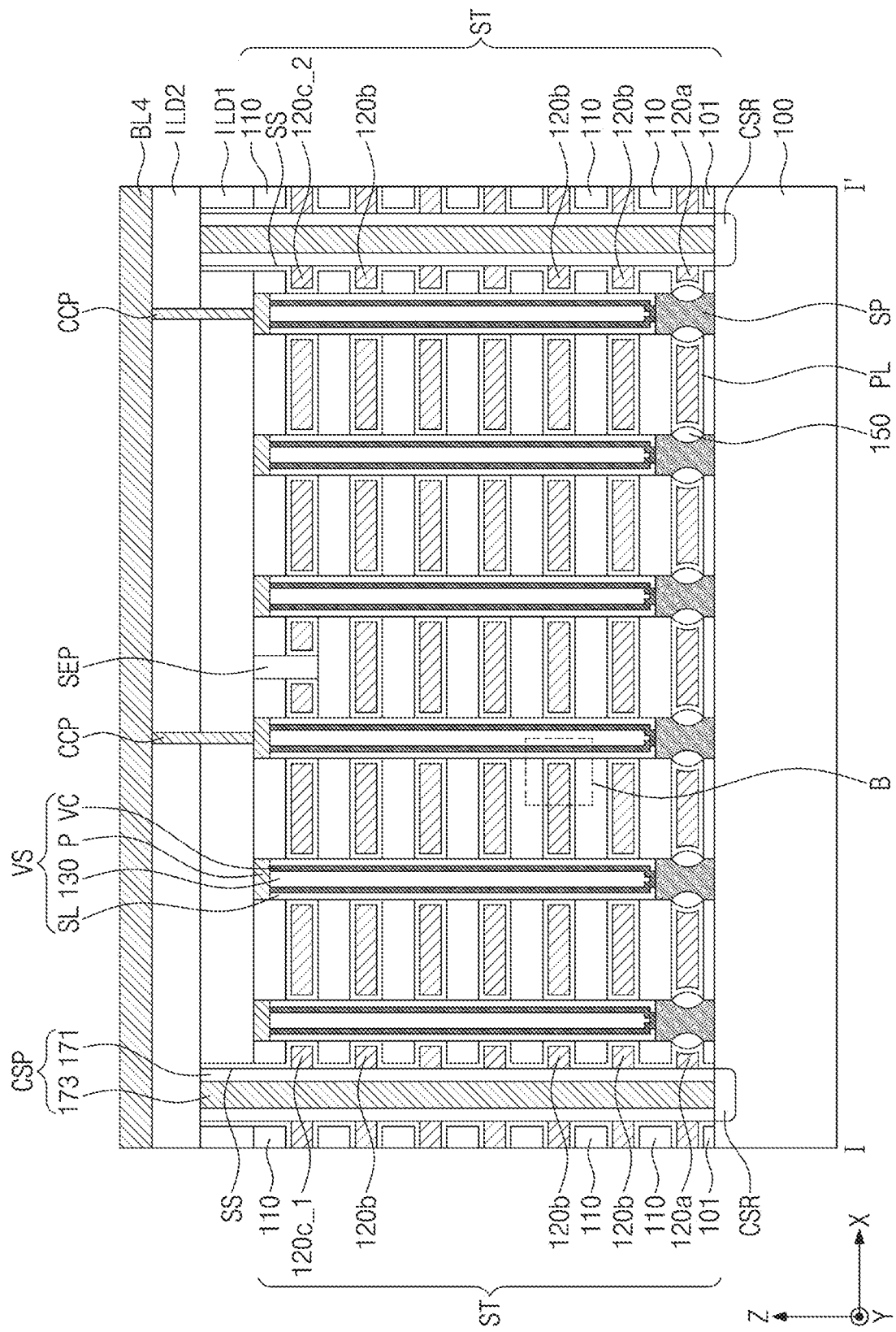
FIG. 4 illustrates a cross-sectional view taken along line I-I' of FIG. 3, showing a three-dimensional semiconductor memory device according to some example embodiments of the present inventive concepts.

Referring to FIG. 2, a plurality of stack structures ST may be disposed on a substrate 100 (FIG. 4). The stack structures ST may be disposed spaced apart in a first direction X. The substrate 100 may be a silicon substrate, a silicon-germanium substrate, a germanium substrate, or a single crystalline epitaxial layer grown on a single crystalline silicon substrate. The substrate 100 may include a cell array region CAR and a pad region PR. The stack structures ST may extend from the cell array region CAR toward the pad region PR of the substrate 100 along a second direction Y intersecting the first direction X. The stack structures ST have end portions that form stepwise structures STS on the pad region PR of the substrate 100. The stack structures ST may include a plurality of gate electrodes 120a, 120b, 120c_1, and 120c_2, all of which have their end portions disposed on the pad region PR of the substrate 100. The gate electrodes 120a, 120b, 120c_1, and 120c_2 may have their lengths in the second direction Y that decrease with increasing distance from the substrate 100. Therefore, the end portions of the gate electrodes 120a, 120b, 120c_1, and 120c_2 may be exposed on the pad region PR of the substrate 100.

Contact plugs CP may be disposed on the stepwise structures STS of the stack structures ST on the pad region PR of the substrate 100. For example, the contact plugs CP may be disposed to correspond to the end portions of the gate electrodes 120a, 120b, 120c_1, and 120c_2.

Figure 3:
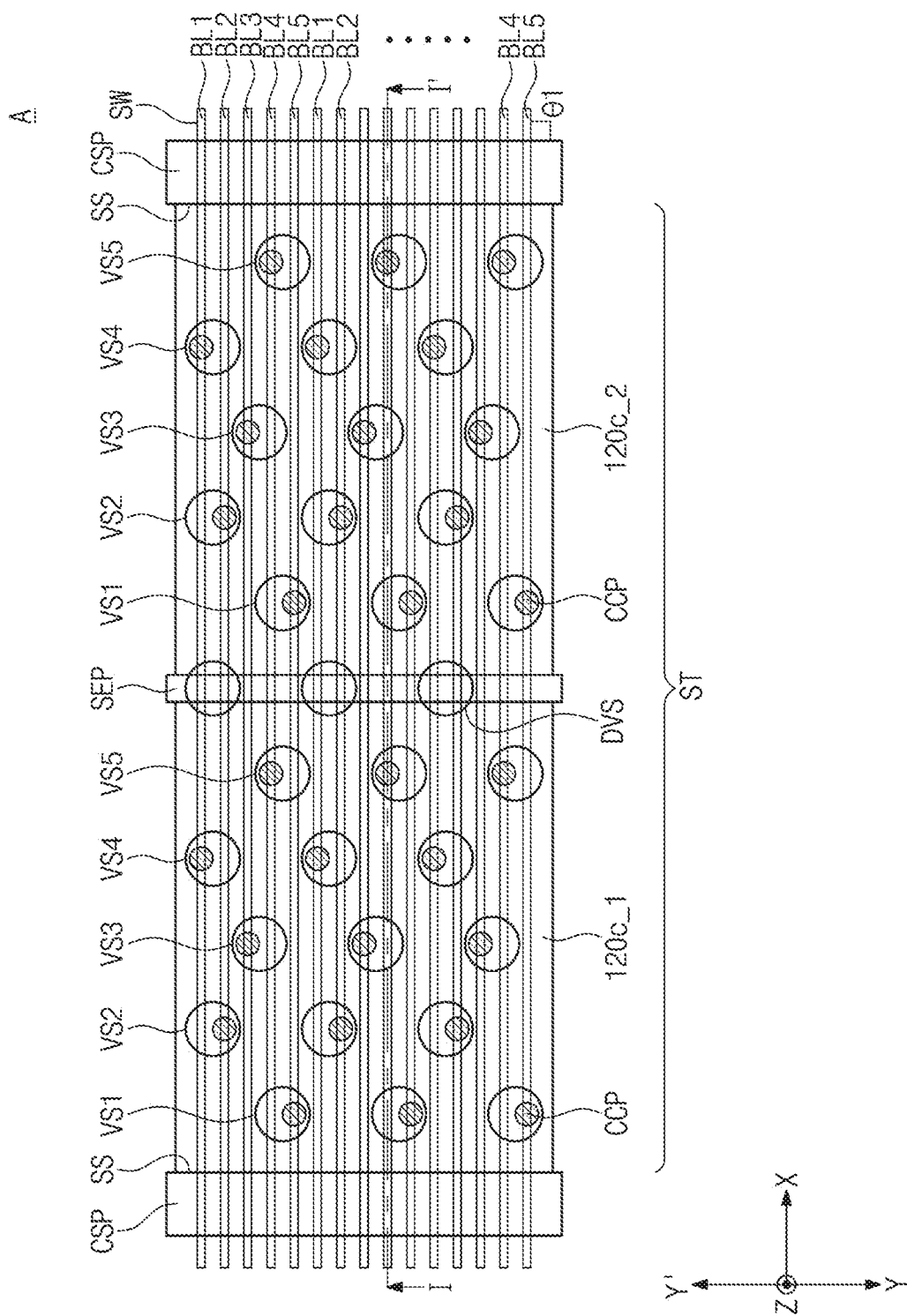
FIG. 3 illustrates an enlarged view showing section A of FIG. 2.
Figure 5:
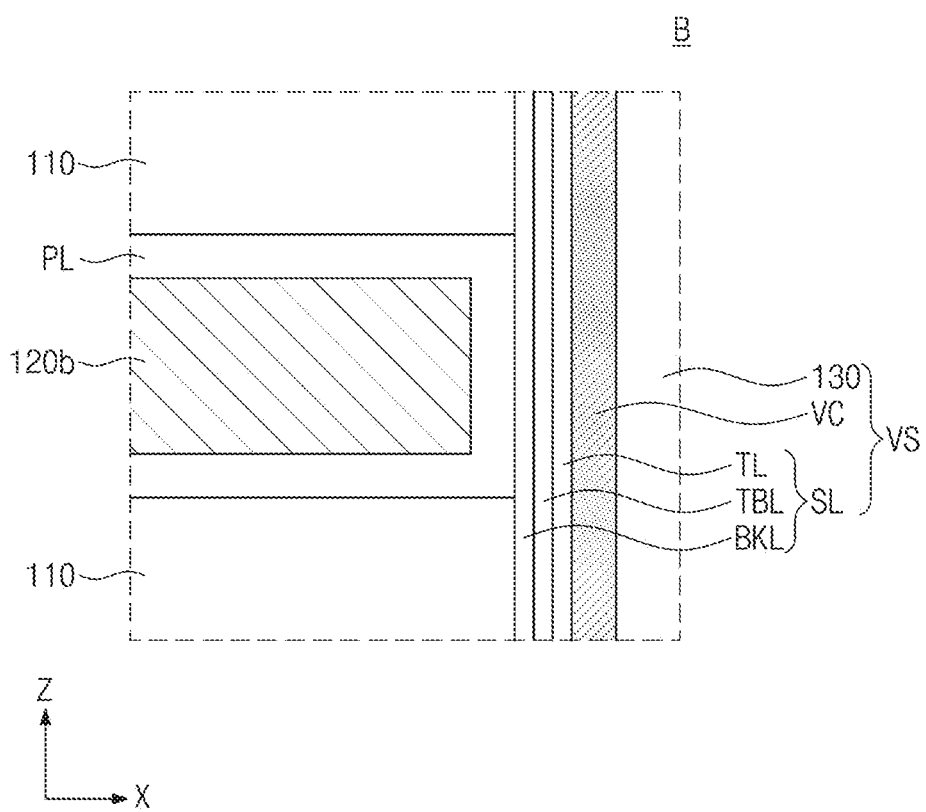
FIG. 5 illustrates an enlarged view showing section B of FIG. 4.
Figure 6:
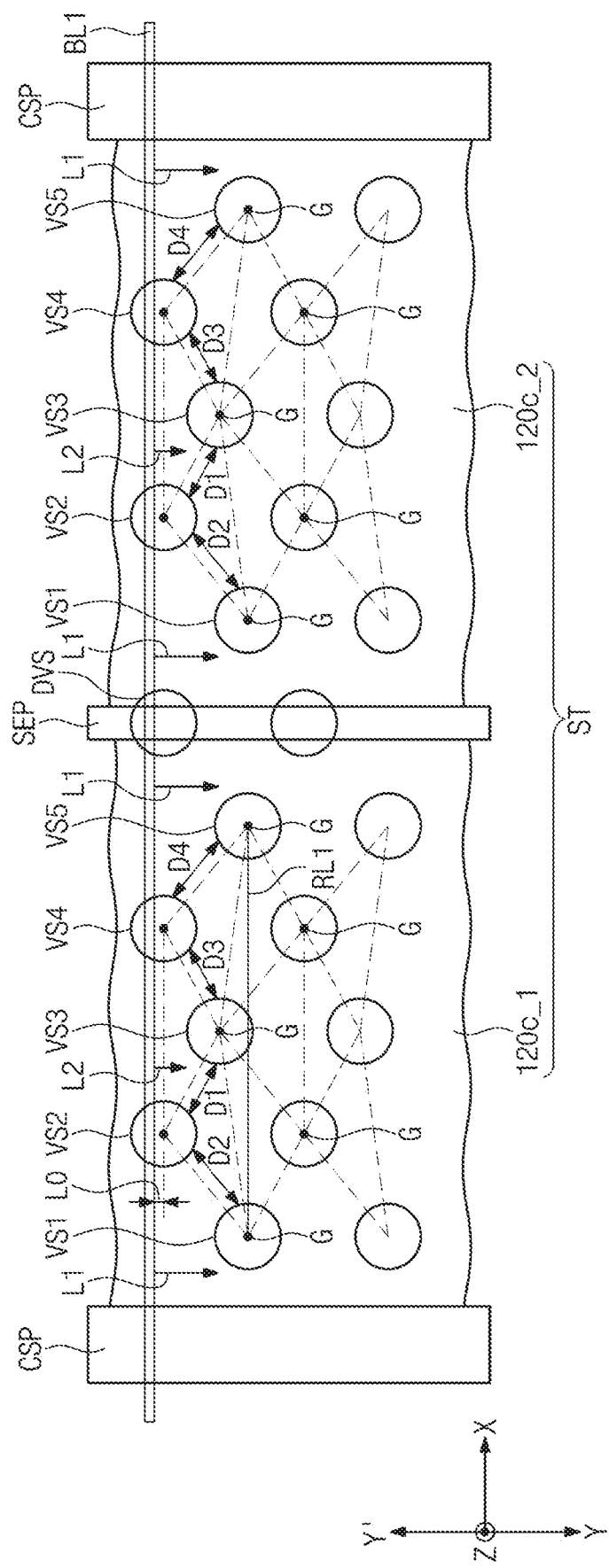
FIG. 6 illustrates an enlarged plan view showing vertical structures of FIG. 3.

FIG. 3 illustrates an enlarged view showing section A of FIG. 2. FIG. 4 illustrates a cross-sectional view taken along line I-I' of FIG. 3, showing a three-dimensional semiconductor memory device according to some example embodiments of the present inventive concepts. FIG. 5 illustrates an enlarged view showing section B of FIG. 4. FIG. 6 illustrates an enlarged plan view showing vertical structures.

Referring to FIGS. 3 and 4, each of the stack structures ST may include the gate electrodes 120a, 120b, 120c_1, and 120c_2, a buffer dielectric layer 101, and dielectric patterns 110. The gate electrodes 120a, 120b, 120c_1, and 120c_2 may include a ground select gate electrode 120a, cell gate electrodes 120b, and string select gate electrodes 120c_1 and 120c_2. The ground select gate electrode 120a may be a lowermost one among the gate electrodes 120a, 120b, 120c_1, and 120c_2, and the string select gate electrodes 120c_1 and 120c_2 may each be an uppermost one among the gate electrodes 120a, 120b, 120c_1, and 120c_2. The cell gate electrodes 120b may be positioned between the ground select gate electrode 120a and the string select gate electrodes 120c_1 and 120c_2. The string select gate electrodes 120c_1 and 120c_2 may include a first string select gate electrode 120c_1 and a second string select gate electrode 120c_2. The first string select gate electrode 120c_1 and the second string select gate electrode 120c_2 may be disposed spaced apart in the first direction X on an uppermost cell gate electrode 120b. The first string select gate electrode 120c_1 and the second string select gate electrode 120c_2 may be electrically/physically separated from each other. The ground select gate electrode 120a may correspond to the ground select line GSL discussed in FIG. 1, the cell gate electrodes 120b may correspond to the word lines WL0 to WL3 discussed in FIG. 1, and the first and second string select gate electrodes 120c_1 and 120c_2 may correspond to the string select lines SSL0 to SSL2 discussed in FIG. 1. The gate electrodes 120a, 120b, 120c_1, 120c_2 may include a semiconductor material (e.g., polysilicon), a metallic material (e.g., tungsten), and/or a metal nitride material (e.g., titanium nitride, tantalum nitride, or tungsten nitride).

The buffer dielectric layer 101 may be disposed between the substrate 100 and the ground select gate electrode 120a. The buffer dielectric layer 101 may include, for example, a silicon oxide layer or a thermal oxide layer. The dielectric patterns 110 may be disposed between the gate electrodes 120a, 120b, 120c_1, and 120c_2 that are adjacent each other in a third direction Z perpendicular to a top surface of the substrate 100. Uppermost ones of the dielectric patterns 110 may be disposed on the first and second string select gate electrodes 120c_1 and 120c_2. The dielectric patterns 110 may include, for example, a silicon oxide layer.

A separation pattern SEP may be disposed on the stack structure ST between the first string select gate electrode 120c_1 and the second string select gate electrode 120c_2. The separation pattern SEP may extend in the second direction Y between the first string select gate electrode 120c_1 and the second string select gate electrode 120c_2. The separation pattern SEP may penetrate the uppermost dielectric pattern 110, and may be disposed on a top surface of the dielectric pattern 110 between the uppermost cell gate electrode 120b and the string select gate electrodes 120c_1 and 120c_2. The separation pattern SEP may include, for example, a silicon oxide layer.

A plurality of vertical structures VS may penetrate the stack structures ST. For example, the vertical structures VS may penetrate the cell gate electrodes 120b, the first and second string select gate electrodes 120c_1 and 120c_2, and the dielectric patterns 110. The vertical structures VS may be arranged in a zigzag shape along the first direction X. Each of the vertical structures VS may include a charge storage structure SL, a vertical channel VC, a gap-fill layer 130, and a pad P. The vertical channel VC may have a hollow pipe shape, a cylindrical shape, or a cup shape. The vertical channel VC may include a single layer or a plurality of layers. The vertical channel VC may include, for example, one or more of a single crystalline silicon layer, an organic semiconductor layer, and carbon nanostructures.

The charge storage structure SL may surround the vertical channel VC. Referring to FIG. 5, the charge storage structure SL may include a tunnel dielectric layer TL, a charge storage layer TBL, and a blocking dielectric layer BKL. The blocking dielectric layer BKL may be disposed between the vertical channel VC and the cell gate electrodes 120b and between the vertical channel VC and the first and second string select gate electrodes 120c_1 and 120c_2, while extending in the third direction Z. The blocking dielectric layer BKL may include, for example, a silicon oxide layer or a high-k dielectric layer (e.g., aluminum oxide ($Al_2O_3$) or hafnium oxide ($HfO_2$)). The tunnel dielectric layer TL may be disposed between the blocking dielectric layer BKL and the vertical channel VC, while extending in the third direction Z. The tunnel dielectric layer TL may include, for example, a silicon oxide layer or a high-k dielectric layer (e.g., aluminum oxide ($Al_2O_3$) or hafnium oxide ($HfO_2$)). The charge storage layer TBL may be disposed between the blocking dielectric layer BKL and the tunnel dielectric layer TL, while extending in the third direction Z. The charge storage layer TBL may include, for example, a silicon nitride layer.

The gap-fill layer 130 may be disposed in an inner space surrounded by the vertical channel VC. The gap-fill layer 130 may include, for example, a silicon oxide layer, a silicon nitride layer, or a silicon oxynitride layer. The pad P may be disposed on an upper portion of each of the vertical channel VC, the charge storage structure SL, and the gap-fill layer 130. The pad P may include a conductive material or a semiconductor material doped with impurities whose conductive type is different from that of the vertical channel VC. A semiconductor pillar SP may be disposed between the vertical channel VC and the substrate 100. The semiconductor pillar SP may be disposed on the top surface of the substrate 100, and may penetrate the ground select gate electrode 120a. The semiconductor pillar SP and the vertical channel VC may be in contact with each other. The semiconductor pillar SP may be either an intrinsic semiconductor or a semiconductor having the same conductive type as that of the substrate 100.

The following will mainly describe a planar arrangement of vertical structures (or first to fifth vertical structures).

Referring to FIGS. 3 and 6, in some embodiments, the vertical structures VS may include first vertical structures VS1, second vertical structures VS2, third vertical structures VS3, fourth vertical structures VS4, and fifth vertical structures VS5. The first to fifth vertical structures VS1 to VS5 may penetrate the stack structure ST and the first and second string select gate electrodes 120c_1 and 120c_2. The first to fifth vertical structures VS1 to VS5 may be sequentially arranged in a zigzag shape along the first direction X. The first vertical structures VS1 may be arranged in the second direction Y. The second vertical structures VS2 may be arranged in the second direction Y. The third vertical structures VS3 may be arranged in the second direction Y. The fourth vertical structures VS4 may be arranged in the second direction Y. The fifth vertical structures VS5 may be arranged in the second direction Y.

The second and fourth vertical structures VS2 and VS4 that are disposed spaced apart in the first direction X may vertically overlap a first bit line BL1 electrically connected to the fourth vertical structures VS4. The second and fourth vertical structures VS2 and VS4 may have their centers G that are spaced apart at the same distance L0 from the first bit line BL1. The first vertical structures VS1 may be spaced apart in the second direction Y at a first distance L1 from the first bit line BL1. The third vertical structures VS3 may be spaced apart in the second direction Y at a second distance L2 from the first bit line BL1. The fifth vertical structures VS5 may be spaced apart in the second direction Y at the first distance L1 from the first bit line BL1. The first distance L1 may be different from the second distance L2. For example, the first distance L1 may be greater than the second distance L2. The first vertical structures VS1 and the fifth vertical structures VS5 that penetrate the first string select gate electrode 120c_1 and the second string select gate electrode 120c_2 may be disposed to face each other in the first direction X. For example, each of the first and fifth vertical structures VS1 and VS5 that are adjacent in the first direction X may have its center G disposed on a first reference line RL1, and each of the third vertical structures VS3 may have its center G spaced apart from the first reference line RL1.

A first minimum (i.e., shortest) distance D1 between neighboring second and third vertical structures VS2 and VS3 may be less than a second minimum distance D2 between neighboring first and second vertical structures VS1 and VS2. A third minimum distance D3 between neighboring third and fourth vertical structures VS3 and VS4 may be less than a fourth minimum distance D4 between neighboring fourth and fifth vertical structures VS4 and VS5. The first minimum distance D1 may be substantially the same as (i.e., substantially equal to) the third minimum distance D3, and the second minimum distance D2 may be substantially the same as the fourth minimum distance D4.

In some embodiments, neighboring first, second, and third vertical structures VS1, VS2, and VS3 may be arranged in a triangular shape or in an inverted triangular shape. For example, neighboring first, second, and third vertical structures VS1, VS2, and VS3 may be disposed in (i.e., may collectively define) an inequilateral triangular shape or in an inverted inequilateral triangular shape. Neighboring third, fourth, and fifth vertical structures VS3, VS4, and VS5 may be arranged in a triangular shape or in an inverted triangular shape. For example, neighboring third, fourth, and fifth vertical structures VS3, VS4, and VS5 may be disposed in an inequilateral triangular shape or in an inverted inequilateral triangular shape. Neighboring second, third, and fourth vertical structures VS2, VS3, and VS4 may be arranged in a triangular shape or in an inverted triangular shape. For example, neighboring second, third, and fourth vertical structures VS2, VS3, and VS4 may be disposed in an isosceles triangular shape or in an inverted isosceles triangular shape.

Dummy vertical structures DVS may penetrate the separation pattern SEP and the stack structure ST. The dummy vertical structures DVS may be arranged (e.g., aligned) in the second direction Y along the separation pattern SEP. The dummy vertical structures DVS may be disposed between the fourth vertical structures VS4 that penetrate the first sting select gate electrode 120c_1 and the second vertical structures VS2 that penetrate the second string select gate electrode 120c_2. The dummy vertical structures DVS may have the same stacking structure as that of layers included in each of the vertical structures VS. For example, each of the dummy vertical structures DVS may include a dummy vertical channel, a dummy charge storage structure that surrounds the dummy vertical channel, a dummy gap-fill layer in an inner space surrounded by the dummy vertical channel, and a dummy pad. In addition, dummy semiconductor pillars may be disposed between the dummy vertical structures and the substrate 100.

Referring back to FIG. 4, a first interlayer dielectric layer ILD1 may be disposed on the stack structures ST. The first interlayer dielectric layer ILD1 may cover a top surface of the uppermost dielectric pattern 110 and a top surface of the separation pattern SEP. The first interlayer dielectric layer ILD1 may include, for example, a silicon oxide layer.

A common source region CSR may be disposed in the substrate 100 between the stack structures ST. The common source region CSR may extend in the second direction Y. The common source region CSR may have a conductive type different from that of the substrate 100. A common source contact structure CSP may be disposed on the substrate 100 between the stack structures ST. The common source contact structure CSP may penetrate the first interlayer dielectric layer ILD1. The common source contact structure CSP may be electrically connected to the common source region CSR. The common source contact structure CSP may include a spacer 171 and a common source contact plug 173. The spacer 171 may surround a sidewall of the common source contact plug 173.

A horizontal dielectric layer PL may be disposed between the charge storage structure SL and the cell gate electrodes 120b, between the charge storage structure SL and the first and second string select gate electrodes 120c_1 and 120c_2, and between the ground select gate electrode 120a and the semiconductor pillar SP, while extending onto top and bottom surfaces of the gate electrodes 120a, 120b, 120c_1, and 120c_2. The horizontal dielectric layer PL may extend between the uppermost dielectric pattern 110 and the common source contact structure CSP and between the first interlayer dielectric layer ILD1 and the common source contact structure CSP. The horizontal dielectric layer PL may include, for example, a silicon oxide layer (e.g., $SiO_2$) or a high-k dielectric layer (e.g., aluminum oxide ($Al_2O_3$) or hafnium oxide ($HfO_2$)).

A gate dielectric layer 150 may be disposed between the semiconductor pillar SP and the horizontal dielectric layer PL that covers a lateral surface of the ground select gate electrode 120a. The gate dielectric layer 150 may have lateral surfaces that are convexly curved in opposite directions. The gate dielectric layer 150 may include, for example, a thermal oxide layer. A second interlayer dielectric layer ILD2 may be disposed on the first interlayer dielectric layer ILD1. The second interlayer dielectric layer ILD2 may cover a top surface of the first interlayer dielectric layer ILD1 and a top surface of the common source contact structure CSP. The second interlayer dielectric layer ILD2 may include, for example, a silicon oxide layer.

Cell contact plugs CCP may be disposed on the pads P. The cell contact plugs CCP may penetrate the first and second interlayer dielectric layers ILD1 and ILD2, and may be in contact with the pads P. The cell contact plugs CCP may be electrically connected to the vertical channels VC. Referring to FIG. 3, the cell contact plugs CCP may be arranged in a zigzag shape along the second direction Y. The cell contact plugs CCP may not extend beyond (i.e., outside) sidewalls of the first to fifth vertical structures VS1 to VS5. For example, the cell contact plug CCP may be disposed on a corresponding one of the first to fifth vertical structures VS1 to VS5, but may not be exactly vertically aligned with a central axis of the corresponding vertical structure.

Referring to FIG. 3, the cell contact plugs CCP may not be disposed on central portions of the first to fifth vertical structures VS1 to VS5. For example, the cell contact plugs CCP may be disposed closer to the sidewalls of the first to fifth vertical structures VS1 to VS5. For example, the cell contact plugs CCP on the first and second vertical structures VS1 and VS2 may be disposed more in the second direction Y away from the central portions of the first and second vertical structures VS1 and VS2. The cell contact plugs CCP on the third to fifth vertical structures VS3 to VS5 may be disposed more in a fourth direction Y', which is opposite to the second direction Y, away from the central portions of the third to fifth vertical structures VS3 to VS5. The cell contact plugs CCP may include a metallic material (e.g., tungsten, copper, or aluminum).

Referring to FIGS. 3 and 4 together, the second interlayer dielectric layer ILD2 may be provided thereon with first, second, third, fourth, and fifth bit lines BL1, BL2, BL3, BL4, and BL5. The first to fifth bit lines BL1 to BL5 may extend in the first direction X while running (i.e., extending) across the structure structures ST and the common source contact structures CSP. In some embodiments, when viewed in a plan view, the stack structures ST may have their lateral surfaces SS that are parallel to the second direction Y and are perpendicular to the top surface of the substrate 100. The lateral surfaces SS parallel to the second direction Y of the stack structures ST may be in contact with the common source contact structures CSP. The first to fifth bit lines BL1 to BL5 may have their sidewalls SW that run (i.e., extend) across the lateral surfaces SS of the stack structures ST and that make a first angle θ1 with the lateral surfaces SS of the stack structures ST. The first angle θ1 may be, for example, a right angle.

The first to fifth bit lines BL1 to BL5 may be sequentially arranged in the second direction Y. The first bit lines BL1 may be in contact with the cell contact plugs CCP disposed on the fourth vertical structures VS4 that penetrate the first string select gate electrode 120c_1 and also with the cell contact plugs CCP disposed on the fourth vertical structures VS4 that penetrate the second string select gate electrode 120c_2. For example, the first bit lines BL1 may be electrically connected to the vertical channels VC of the fourth vertical structures VS4 that penetrate the first and second string select gate electrodes 120c_1 and 120c_2. The second bit lines BL2 may be in contact with the cell contact plugs CCP disposed on the second vertical structures VS2 that penetrate the first string select gate electrode 120c_1 and also with the cell contact plugs CCP disposed on the second vertical structures VS2 that penetrate the second string select gate electrode 120c_2. For example, the second bit lines BL2 may be electrically connected to the vertical channels VC of the second vertical structures VS2 that penetrate the first and second string select gate electrodes 120c_1 and 120c_2.

The third bit lines BL3 may be in contact with the cell contact plugs CCP disposed on the third vertical structures VS3 that penetrate the first string select gate electrode 120c_1 and also with the cell contact plugs CCP disposed on the third vertical structures VS3 that penetrate the second string select gate electrode 120c_2. For example, the third bit lines BL3 may be electrically connected to the vertical channels VC of the third vertical structures VS3 that penetrate the first and second string select gate electrodes 120c_1 and 120c_2. The fourth bit lines BL4 may be in contact with the cell contact plugs CCP disposed on the fifth vertical structures VS5 that penetrate the first string select gate electrode 120c_1 and also with the cell contact plugs CCP disposed on the fifth vertical structures VS5 that penetrate the second string select gate electrode 120c_2. For example, the fourth bit lines BL4 may be electrically connected to the vertical channels VC of the fifth vertical structures VS5 that penetrate the first and second string select gate electrodes 120c_1 and 120c_2. The fifth bit lines BL5 may be in contact with the cell contact plugs CCP disposed on the first vertical structures VS1 that penetrate the first string select gate electrode 120c_1 and also with the cell contact plugs CCP disposed on the first vertical structures VS1 that penetrate the second string select gate electrode 120c_2. For example, the fifth bit lines BL5 may be electrically connected to the vertical channels VC of the first vertical structures VS1 that penetrate the first and second string select gate electrodes 120c_1 and 120c_2.

According to some example embodiments of the present inventive concepts, the third vertical structures VS3 may not be disposed linearly (i.e., may not be collinear) with the first and fifth vertical structures VS1 and VS5, and the centers G of the third vertical structures VS3 may be disposed spaced apart in the fourth direction Y' from the first reference line RL1 that passes through the centers G of the first and fifth vertical channels VS1 and VS5. Accordingly, neighboring first to fifth bit lines BL1 to BL5 may have electrical connection, without electrical shorts therebetween, with the first to fifth vertical structures VS1 to VS5 that penetrate the first and second string select gate electrodes 120c_1 and 120c_2 so as to allow the first to fifth vertical structures VS1 to VS5 that penetrate the first string select gate electrode 120c_1 to correspond to the first to fifth vertical structures VS1 to VS5 that penetrate the second string select gate electrode 120c_2.

Figure 7:
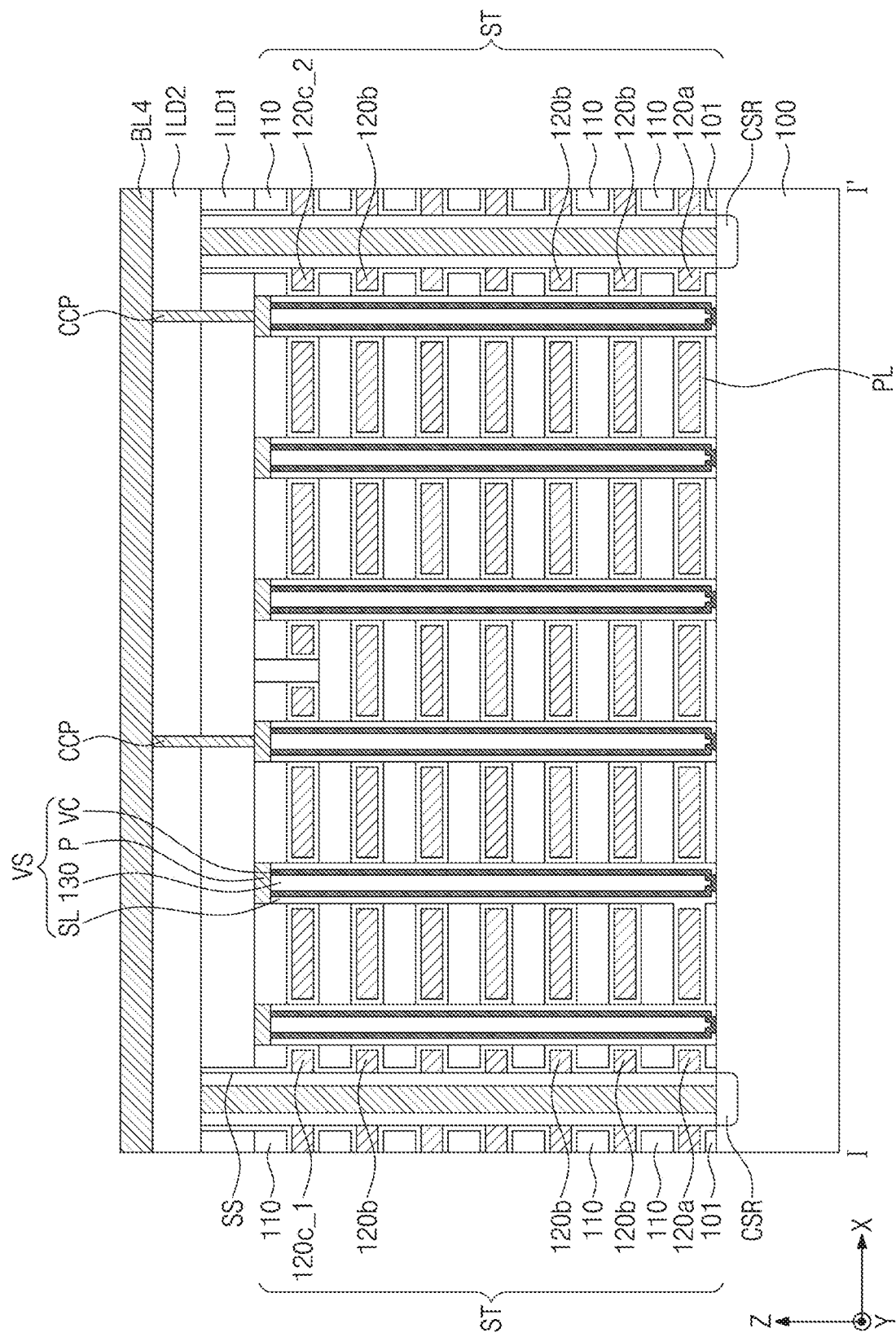
FIG. 7 illustrates a cross-sectional view taken along line I-I' of FIG. 3, showing a three-dimensional semiconductor memory device according to some example embodiments of the present inventive concepts.

FIG. 7 illustrates a cross-sectional view taken along line I-I' of FIG. 3, showing a three-dimensional semiconductor memory device according to some example embodiments of the present inventive concepts.

Referring to FIG. 7, the vertical channels VC and the charge storage structures SL may be in direct contact with the substrate 100. For example, a device may include neither the semiconductor pillars SP nor the gate dielectric layers 150 discussed above with reference to FIG. 4.

Figure 8:
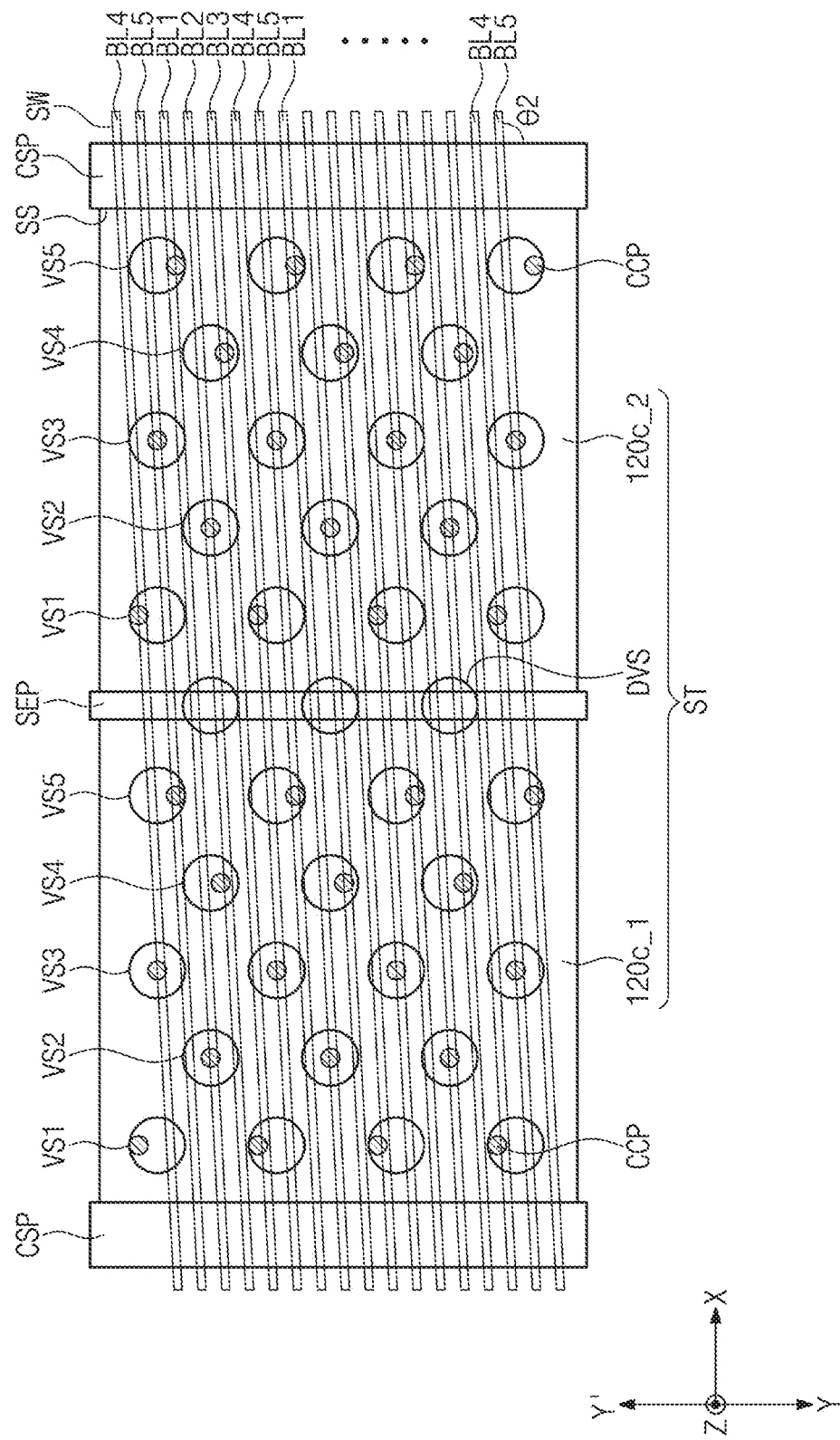
FIG. 8 illustrates an enlarged view showing section A of FIG. 2.
Figure 9:
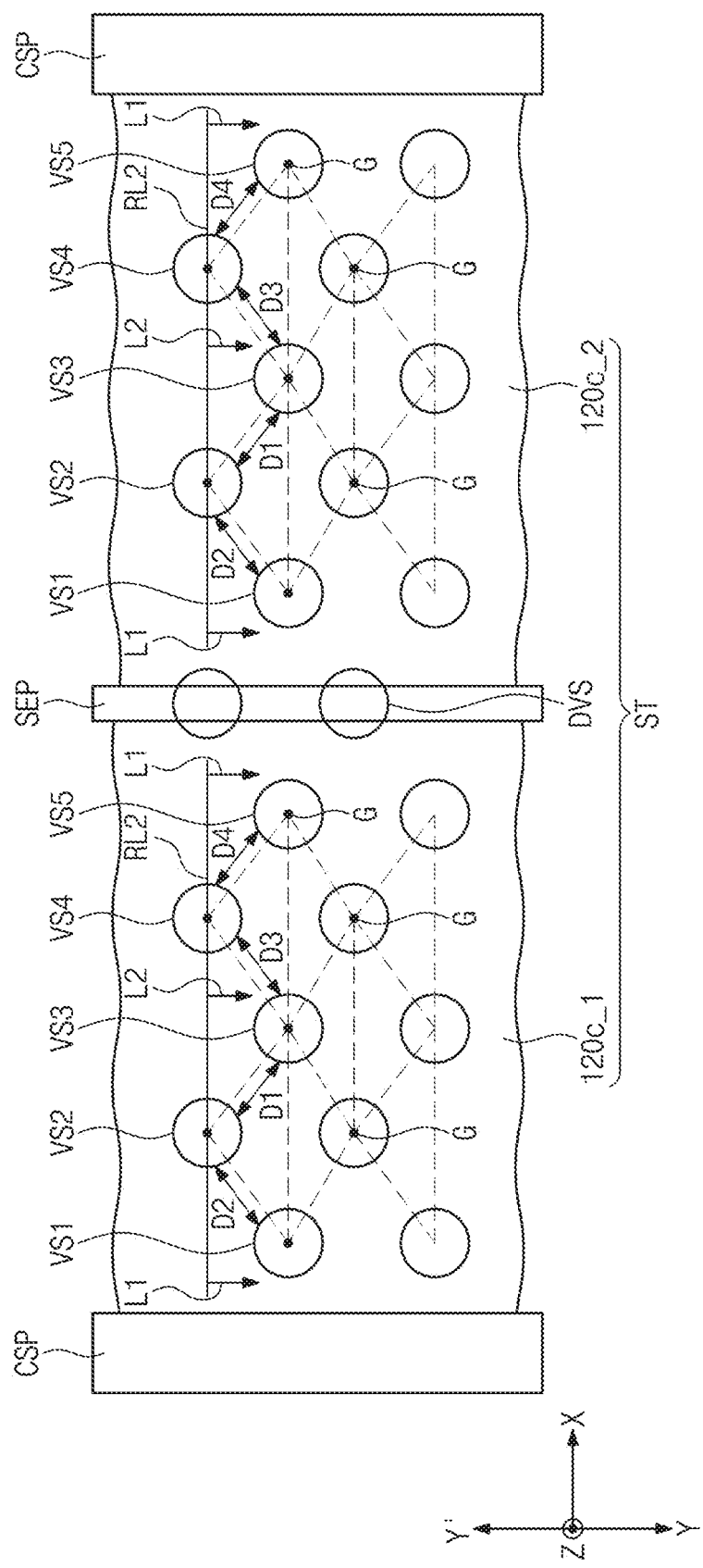
FIG. 9 illustrates an enlarged plan view showing vertical structures of FIG. 8.

FIG. 8 illustrates an enlarged view showing section A of FIG. 2. FIG. 9 illustrates an enlarged plan view showing vertical structures of FIG. 8. The following will mainly describe a planar arrangement of vertical structures (or first to fifth vertical structures).

Referring to FIGS. 8 and 9, the first vertical structure VS1 may be spaced apart in the second direction Y at a first distance L1 from a second reference line RL2 that passes through the centers G of the second and fourth vertical structures VS2 and VS4. The third vertical structure VS3 may be spaced apart in the second direction Y at a second distance L2 from the second reference line RL2. The fifth vertical structure VS5 may be spaced apart in the second direction Y at the first distance L1 from the second reference line RL2 that passes through the centers G of the second and fourth vertical structures VS2 and VS4. The first distance L1 may be substantially the same as the second distance L2.

A first minimum distance D1 between neighboring second and third vertical structures VS2 and VS3 may be substantially the same as a second minimum distance D2 between neighboring first and second vertical structures VS1 and VS2. A third minimum distance D3 between neighboring third and fourth vertical structures VS3 and VS4 may be substantially the same as a fourth minimum distance D4 between neighboring fourth and fifth vertical structures VS4 and VS5. The first minimum distance D1 may be substantially the same as the third minimum distance D3, and the second minimum distance D2 may be substantially the same as the fourth minimum distance D4.

In some embodiments, neighboring first, second, and third vertical structures VS1, VS2, and VS3 may be arranged in a triangular shape or in an inverted triangular shape. For example, neighboring first, second, and third vertical structures VS1, VS2, and VS3 may be disposed in an isosceles triangular shape or in an inverted isosceles triangular shape. Neighboring third, fourth, and fifth vertical structures VS3, VS4, and VS5 may be arranged in a triangular shape or in an inverted triangular shape. For example, neighboring third, fourth, and fifth vertical structures VS3, VS4, and VS5 may be disposed in an isosceles triangular shape or in an inverted isosceles triangular shape. Neighboring second, third, and fourth vertical structures VS2, VS3, and VS4 may be arranged in a triangular shape or in an inverted triangular shape. For example, neighboring second, third, and fourth vertical structures VS2, VS3, and VS4 may be disposed in an isosceles triangular shape or in an inverted isosceles triangular shape.

Referring back to FIG. 8, the first to fifth bit lines BL1 to BL5 may be sequentially arranged in the second direction Y. The first bit lines BL1 may be in contact with the cell contact plugs CCP on the second vertical structures VS2 that penetrate the first string select gate electrode 120c_1 and also with the cell contact plugs CCP on the fifth vertical structures VS5 that penetrate the second string select gate electrode 120c_2. The second bit lines BL2 may be in contact with the cell contact plugs CCP on the fourth vertical structures VS4 that penetrate the first string select gate electrode 120c_1 and also with the cell contact plugs CCP on the second vertical structures VS2 that penetrate the second string select gate electrode 120c_2.

The third bit lines BL3 may be in contact with the cell contact plugs CCP on the first vertical structures VS1 that penetrate the first string select gate electrode 120c_1 and also with the cell contact plugs CCP on the fourth vertical structures VS4 that penetrate the second string select gate electrode 120c_2. The fourth bit lines BL4 may be in contact with the cell contact plugs CCP on the third vertical structures VS3 that penetrate the first string select gate electrode 120c_1 and also with the cell contact plugs CCP on the first vertical structures VS1 that penetrate the second string select gate electrode 120c_2. The fifth bit lines BL5 may be in contact with the cell contact plugs CCP on the fifth vertical structures VS5 that penetrate the first string select gate electrode 120c_1 and also with the cell contact plugs CCP on the third vertical structures VS3 that penetrate the second string select gate electrode 120c_2.

When viewed in a plan view, the lateral surfaces SS parallel to the second direction Y of the stack structures ST may be perpendicular to the top surface of the substrate 100. The first to fifth bit lines BL1 to BL5 may have their sidewalls SW that run (i.e., extend) across the lateral surfaces SS of the stack structures ST and that make a second angle θ2 with the lateral surfaces SS of the stack structures ST. The second angle θ2 may be, for example, an acute angle or an obtuse angle.

According to some example embodiments of the present inventive concepts, when viewed in a plan view, the first to fifth bit lines BL1 to BL5 may be slanted relative to the first direction X. Accordingly, neighboring first to fifth bit lines BL1 to BL5 may have electrical connection, without electrical shorts therebetween, with the first to fifth vertical structures VS1 to VS5 that penetrate the first and second string select gate electrodes 120c_1 and 120c_2 so as to allow the first to fifth vertical structures VS1 to VS5 that penetrate the first string select gate electrode 120c_1 to correspond to the first to fifth vertical structures VS1 to VS5 that penetrate the second string select gate electrode 120c_2.

Figure 10:
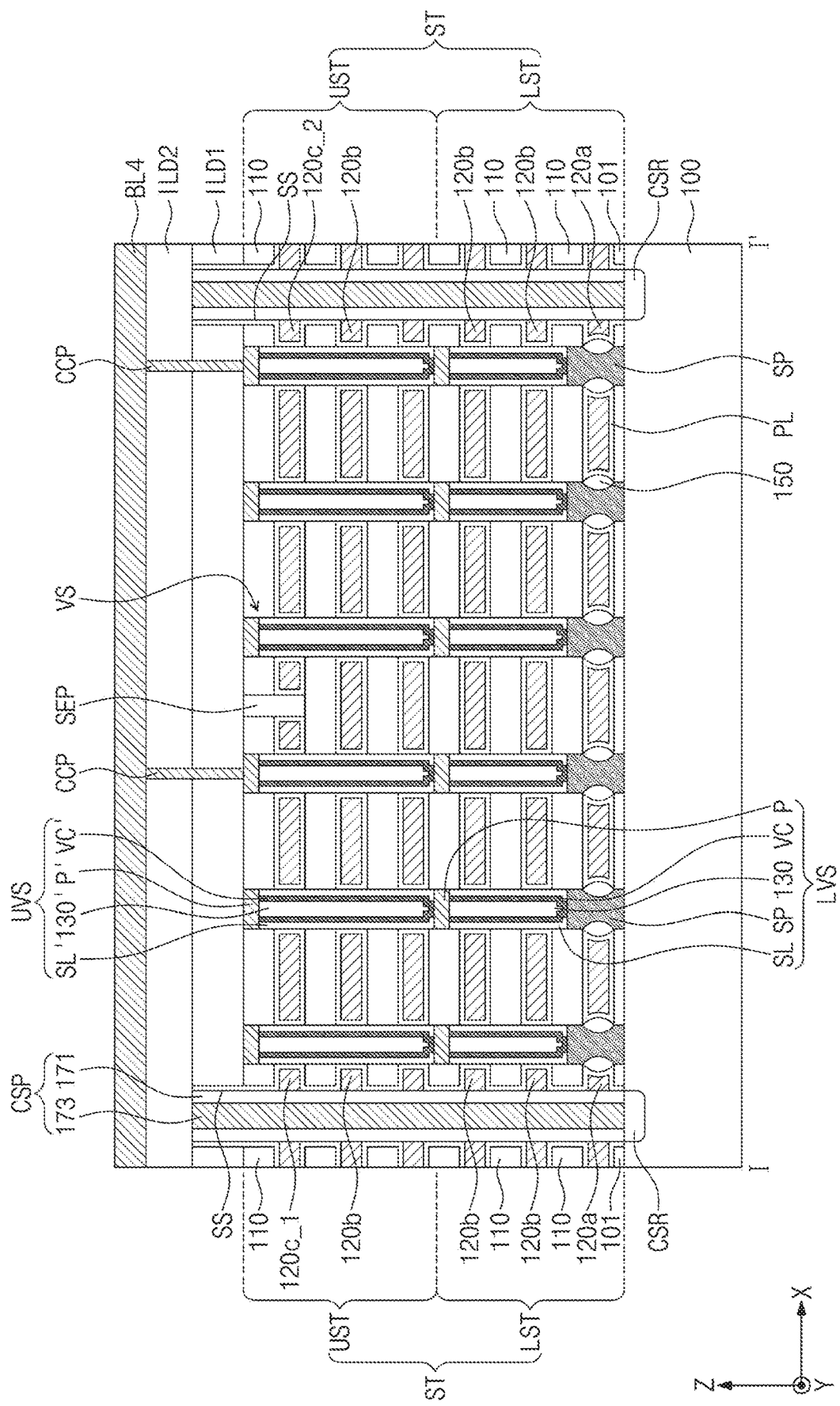
FIG. 10 illustrates a cross-sectional view taken along line I-I' of FIG. 3, showing a three-dimensional semiconductor memory device according to some example embodiments of the present inventive concepts.

FIG. 10 illustrates a cross-sectional view taken along line I-I' of FIG. 3, showing a three-dimensional semiconductor memory device according to some example embodiments of the present inventive concepts.

Referring to FIG. 10, each of the stack structures ST may include a lower stack structure LST and an upper stack structure UST. The upper stack structure UST may be disposed on the lower stack structure LST. For example, the ground select gate electrode 120a may correspond to a lowermost gate electrode of the lower stack structure LST, the string select gate electrodes 120c_1 and 120c_2 may each correspond to an uppermost gate electrode of the upper stack structure UST, and the cell gate electrodes 120b may correspond to gate electrodes between the lowermost gate electrode of the lower stack structure LST and the uppermost gate electrode of the upper stack structure UST.

The vertical structures VS may penetrate the lower stack structure LST and the upper stack structure UST. Each of the vertical structures VS may include a lower vertical structure LVS and an upper vertical structure UVS. The lower vertical structure LVS may penetrate the lower stack structure LST, and the upper vertical structure UVS may penetrate the upper stack structure UST. For example, the upper vertical structure UVS may be disposed on the lower vertical structure LVS. The upper vertical structure UVS and the lower vertical structure LVS may be electrically connected to each other.

The lower vertical structure LVS may include a vertical channel VC, a charge storage structure SL, a gap-fill layer 130, and a pad P. The upper vertical structure UVS may include a vertical channel VC', a charge storage structure SL', a gap-fill layer 130', and a pad P'. The semiconductor pillar SP may be disposed between the lower vertical structure LVS and the substrate 100, and may penetrate the ground select gate electrode 120a. A lower portion of the vertical channel VC' of the upper vertical structure UVS and a lower portion of the charge storage structure SL' of the upper vertical structure UVS may be in contact with the pad P of the lower vertical structure LVS. A lower portion of the upper vertical structure UVS may be disposed on/in the pad P of the lower vertical structure LVS.

In some embodiments, as shown in FIG. 10, the lower and upper vertical structures LVS and UVS may have their sidewalls perpendicular to the top surface of the substrate 100. In other embodiments, the lower and upper vertical structures LVS and UVS may have their sidewalls inclined relative to the top surface of the substrate 100. The lower vertical structure LVS may have a lower width less than an upper width of the lower vertical structure LVS. The upper vertical structure UVS may have a lower width less than an upper width of the upper vertical structure UVS. The upper width of the lower vertical structure LVS may be greater than the lower width of the upper vertical structure UVS. The lower and upper vertical structures UVS and LVS may each have a tapered shape.

Figure 11:
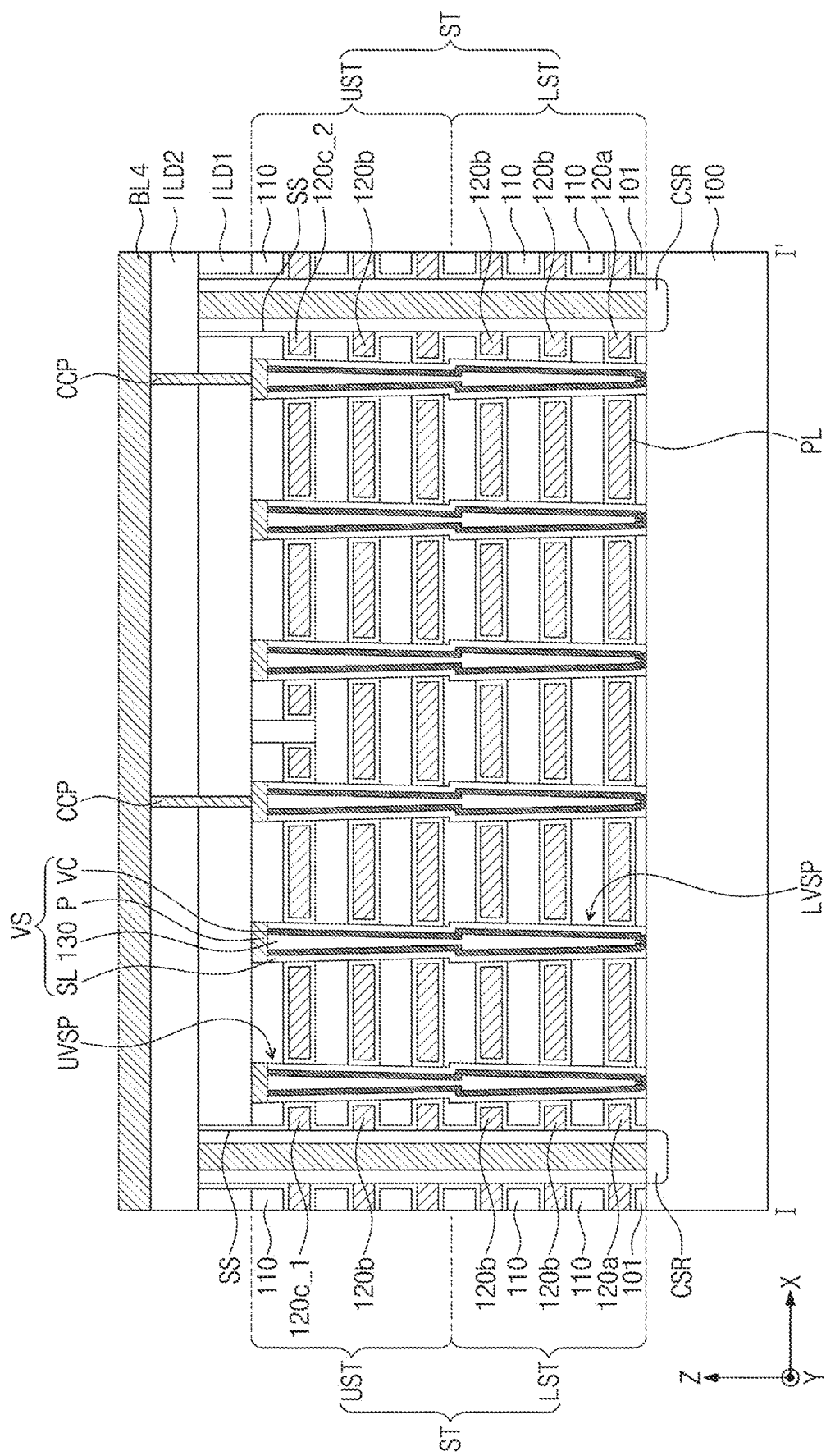
FIG. 11 illustrates a cross-sectional view taken along line I-I' of FIG. 3, showing a three-dimensional semiconductor memory device according to some example embodiments of the present inventive concepts.

FIG. 11 illustrates a cross-sectional view taken along line I-I' of FIG. 3, showing a three-dimensional semiconductor memory device according to some example embodiments of the present inventive concepts.

Referring to FIG. 11, each of the vertical structures VS may include a lower vertical structure part LVSP and an upper vertical structure part UVSP. The lower vertical structure part LVSP may penetrate the lower stack structure LST, and the upper vertical structure part UVSP may penetrate the upper stack structure UST. The lower vertical structure part LVSP and the upper vertical structure part UVSP may be integrally connected into a single body. For example, the vertical channel VC of the lower vertical structure part LVSP may be integrally connected to the vertical channel VC of the upper vertical structure part UVSP, and the charge storage structure SL of the lower vertical structure part LVSP may be integrally connected to the charge storage structure SL of the upper vertical structure part UVSP. The gap-fill layer 130 of the lower vertical structure part LVSP may be integrally connected to the gap-fill layer 130 of the upper vertical structure part UVSP. The pad P of the vertical structure VS may be disposed on an upper portion of the upper vertical structure part UVSP. There may be no semiconductor pillar SP discussed with reference with FIG. 10.

In some embodiments, the lower vertical structure part LVSP may have a sidewall inclined relative to the top surface of the substrate 100, and the upper vertical structure part UVSP may have a sidewall inclined relative to the top surface of the substrate 100. For example, the sidewall of the lower vertical structure part LVSP may be misaligned with the sidewall of the upper vertical structure part UVSP. The lower vertical structure part LVSP may have a lower width less than an upper width of the lower vertical structure part LVSP. The upper vertical structure part UVSP may have a lower width less than an upper width of the upper vertical structure part UVSP. The upper width of the lower vertical structure part LVSP may be greater than the lower width of the upper vertical structure part UVSP. In other embodiments, the lower vertical structure part LVSP may have a sidewall perpendicular to the top surface of the substrate 100, and the upper vertical structure part UVSP may have a sidewall perpendicular to the top surface of the substrate 100.

Figure 12:
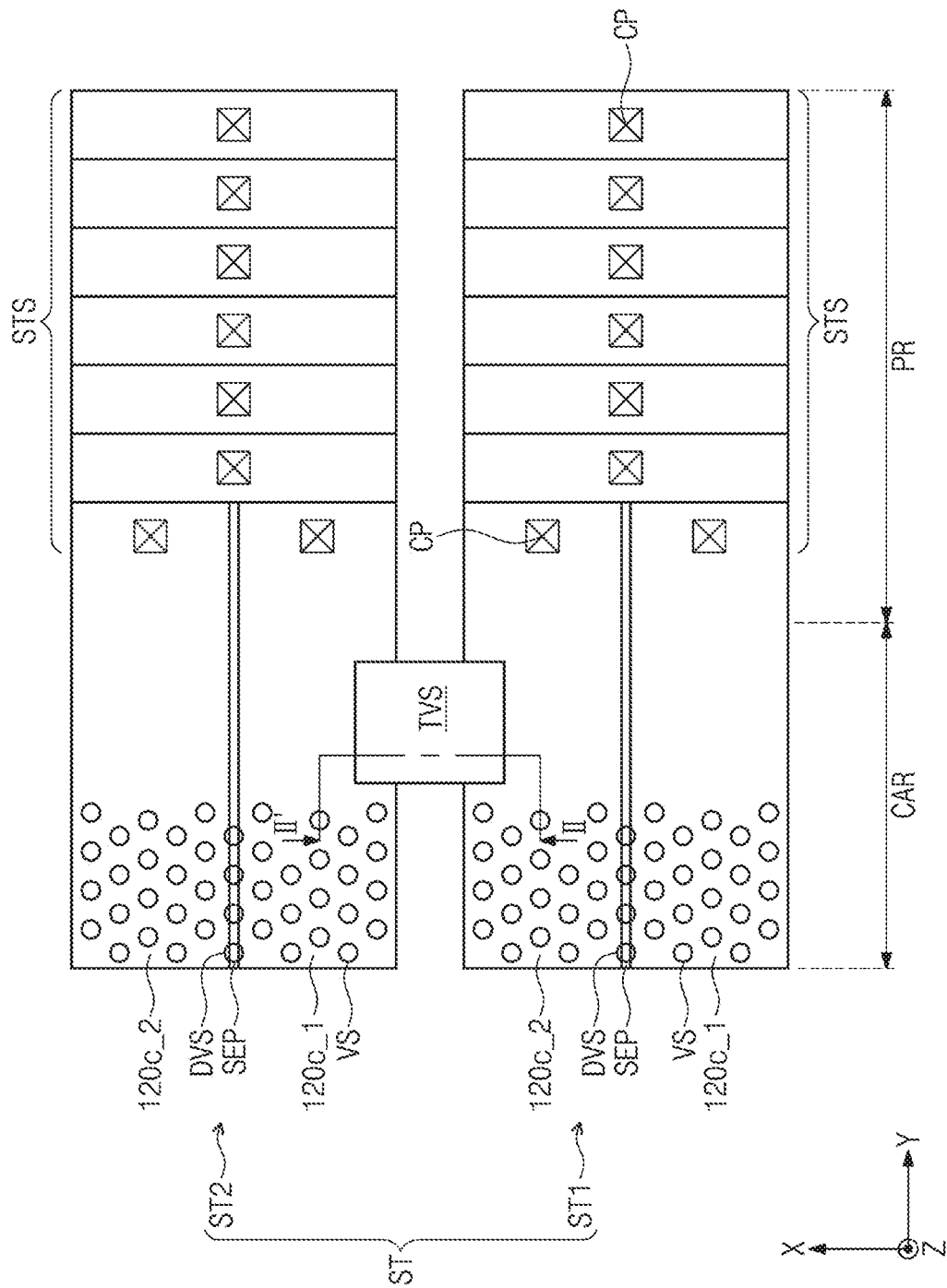
FIG. 12 illustrates a plan view showing a three-dimensional semiconductor memory device according to some example embodiments of the present inventive concepts.
Figure 13:
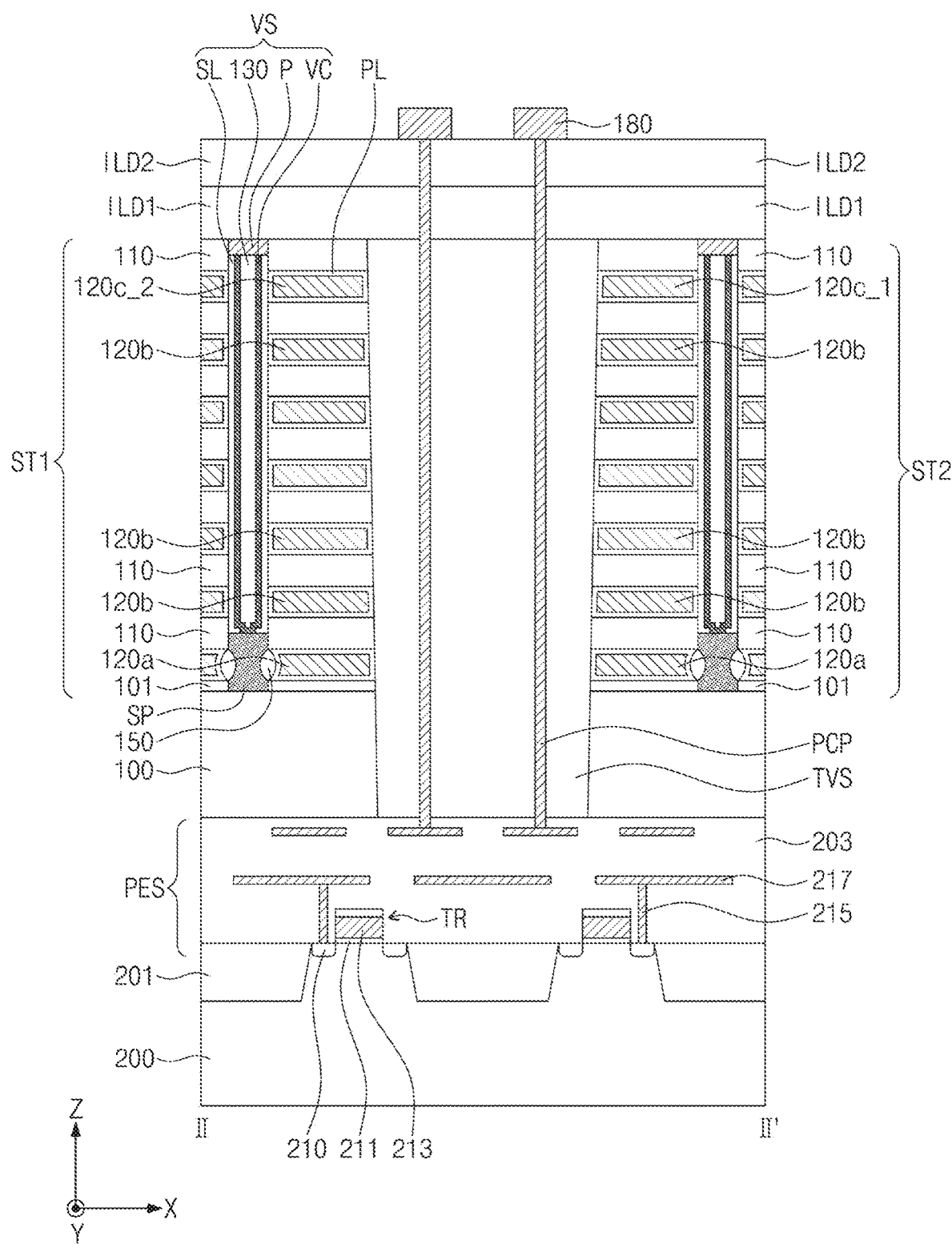
FIG. 13 illustrates a cross-sectional view taken along line II-IF of FIG. 12, showing a three-dimensional semiconductor memory device according to some example embodiments of the present inventive concepts.

FIG. 12 illustrates a plan view showing a three-dimensional semiconductor memory device according to some example embodiments of the present inventive concepts. FIG. 13 illustrates a cross-sectional view taken along line II-IF of FIG. 12, showing a three-dimensional semiconductor memory device according to some example embodiments of the present inventive concepts.

Referring to FIGS. 12 and 13, the stack structure ST may include a first stack structure ST1 and a second stack structure ST2. The first and second stack structures ST1 and ST2 may be disposed spaced apart from each other in the first direction X. Each of the first and second stack structures ST1 and ST2 may include the buffer dielectric layer 101, the dielectric patterns 110, and the gate electrodes 120a, 120b, 120c_1, and 120c_2.

A lower substrate 200 may be disposed below the substrate 100. The lower substrate 200 may be a silicon substrate, a silicon-germanium substrate, a germanium substrate, or a single crystalline epitaxial layer grown on a single crystalline silicon substrate. A device isolation layer 201 may be disposed in the lower substrate 200. The device isolation layer 201 may include a dielectric material (e.g., a silicon oxide layer). The device isolation layer 201 may define active regions of the lower substrate 200.

A peripheral circuit structure PES may be disposed between the lower substrate 200 and the substrate 100. The peripheral circuit structure PES may include a lower interlayer dielectric layer 203, transistors TR, vias 215, and lower connection lines 217. The lower interlayer dielectric layer 203 may be disposed between the lower substrate 200 and the substrate 100. The lower interlayer dielectric layer 203 may include, for example, a silicon oxide layer or a silicon nitride layer. Each of the transistors TR may include source/drain regions 210, a peripheral circuit gate dielectric layer 211, and a peripheral circuit gate electrode 213. The peripheral circuit gate electrode 213 may be disposed in the lower interlayer dielectric layer 203. The peripheral circuit gate electrode 213 may be disposed on each of the active regions of the lower substrate 200. The peripheral circuit gate dielectric layer 211 may be disposed between the peripheral circuit gate electrode 213 and the lower substrate 200. The source/drain regions 210 may be disposed in the active regions of the lower substrate 200 on opposite sides of the peripheral circuit gate electrode 213. The lower connection lines 217 may be disposed in the lower interlayer dielectric layer 203. The vias 215 may be disposed between and may electrically connect the lower connection lines 217 and the source/drain regions 210.

A through dielectric pattern TVS may penetrate the first and second stack structures ST1 and ST2 and also penetrate the substrate 100. The through dielectric pattern TVS may be disposed adjacent to the pad region PR of the substrate 100. For example, the through dielectric pattern TVS may be disposed between the vertical structures VS that are most adjacent (i.e., closest) to the pad region PR and the contact plugs CP that penetrate the first and second string select gate electrodes 120c_1 and 120c_2. The through dielectric pattern TVS may be disposed on a top surface of the lower interlayer dielectric layer 203. The through dielectric pattern TVS may include, for example, a silicon oxide layer.

Peripheral circuit contact plugs PCP may be disposed in the through dielectric pattern TVS. For example, the peripheral circuit contact plugs PCP may penetrate the through dielectric pattern TVS, the first interlayer dielectric layer ILD1, and the second interlayer dielectric layer ILD2. The peripheral circuit contact plugs PCP may be electrically connected to the transistors TR through the lower connection lines 217 and the vias 215. Upper connection lines 180 may be disposed on the second interlayer dielectric layer ILD2. The upper connection lines 180 may be electrically connected to the peripheral circuit contact plugs PCP.

Figure 14:
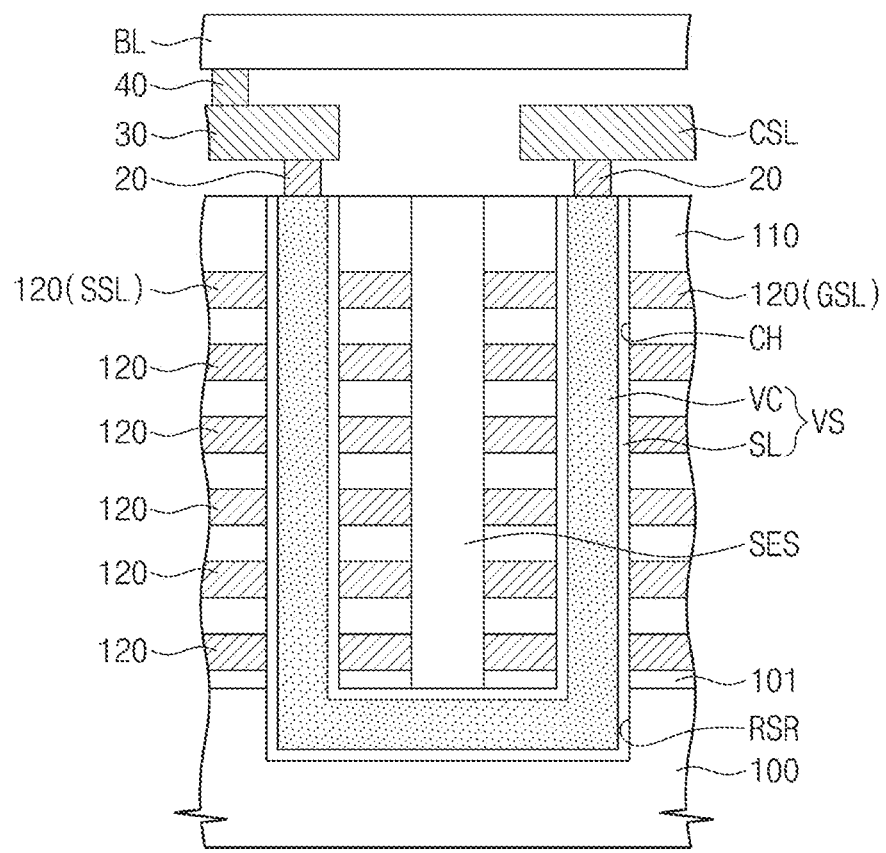
FIG. 14 illustrates a cross-sectional view showing a three-dimensional semiconductor memory device according to some example embodiments of the present inventive concepts.

FIG. 14 illustrates a cross-sectional view showing a three-dimensional semiconductor memory device according to some example embodiments of the present inventive concepts. A description of duplicate components will be omitted in the interest of brevity.

Referring to FIG. 14, a separation structure SES may separate gate electrodes 120 in a first direction X. An uppermost gate electrode 120 may include a sting select line SSL and a ground select line GSL that are separated in the first direction X by the separation structure SES. A plurality of channel holes CH may be provided to penetrate the gate electrodes 120, dielectric patterns 110, and a buffer dielectric layer 101. A substrate 100 may be provided therein with a recess region RSR that spatially connects a pair of channel holes CH that are spaced apart in the first direction X. For example, one channel hole CH that penetrates the string select line SSL may be spatially connected to another channel hole CH that is adjacent to the one channel hole CH and penetrates the ground select line GSL. A vertical structure VS may be provided in the channel holes CH.

The vertical structure VS may include a charge storage structure SL and a vertical channel VC that are sequentially provided in the channel holes CH. The vertical structure VS may have an end that penetrates the string select line SSL and is sequentially provided thereon with a first contact 20, a subsidiary connection line 30, and a second contact 40 that are used to connect the vertical structure VS to a bit line BL. The vertical structure VS may have an opposite end that penetrates the ground select line GSL and is connected through another first contact 20 to a common source line CSL.

Figure 15A:
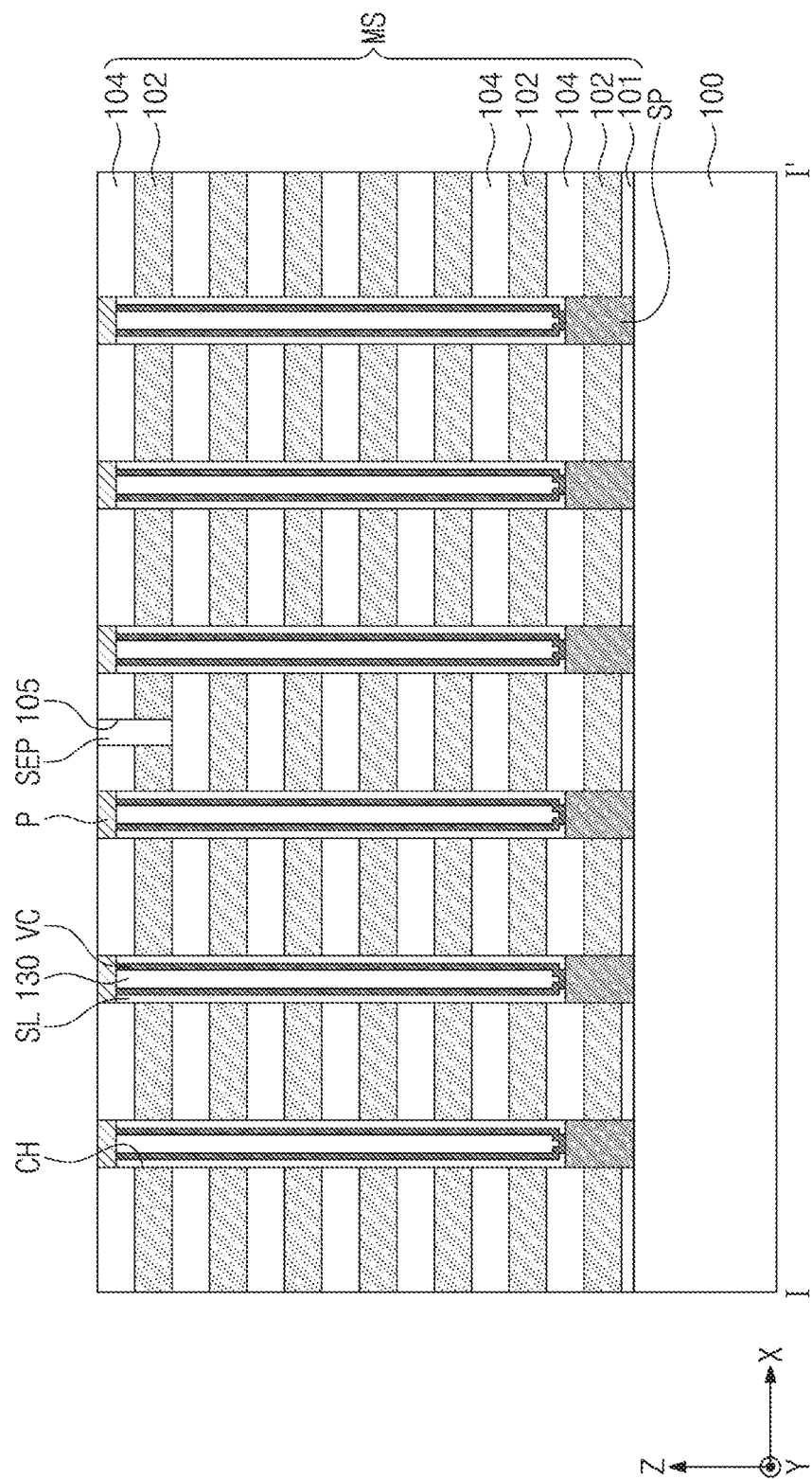
FIGS. 15A to 15C illustrate cross-sectional views taken along line I-I' of FIG. 3, showing a method of fabricating a three-dimensional semiconductor memory device according to some example embodiments of the present inventive concepts.
Figure 15B:
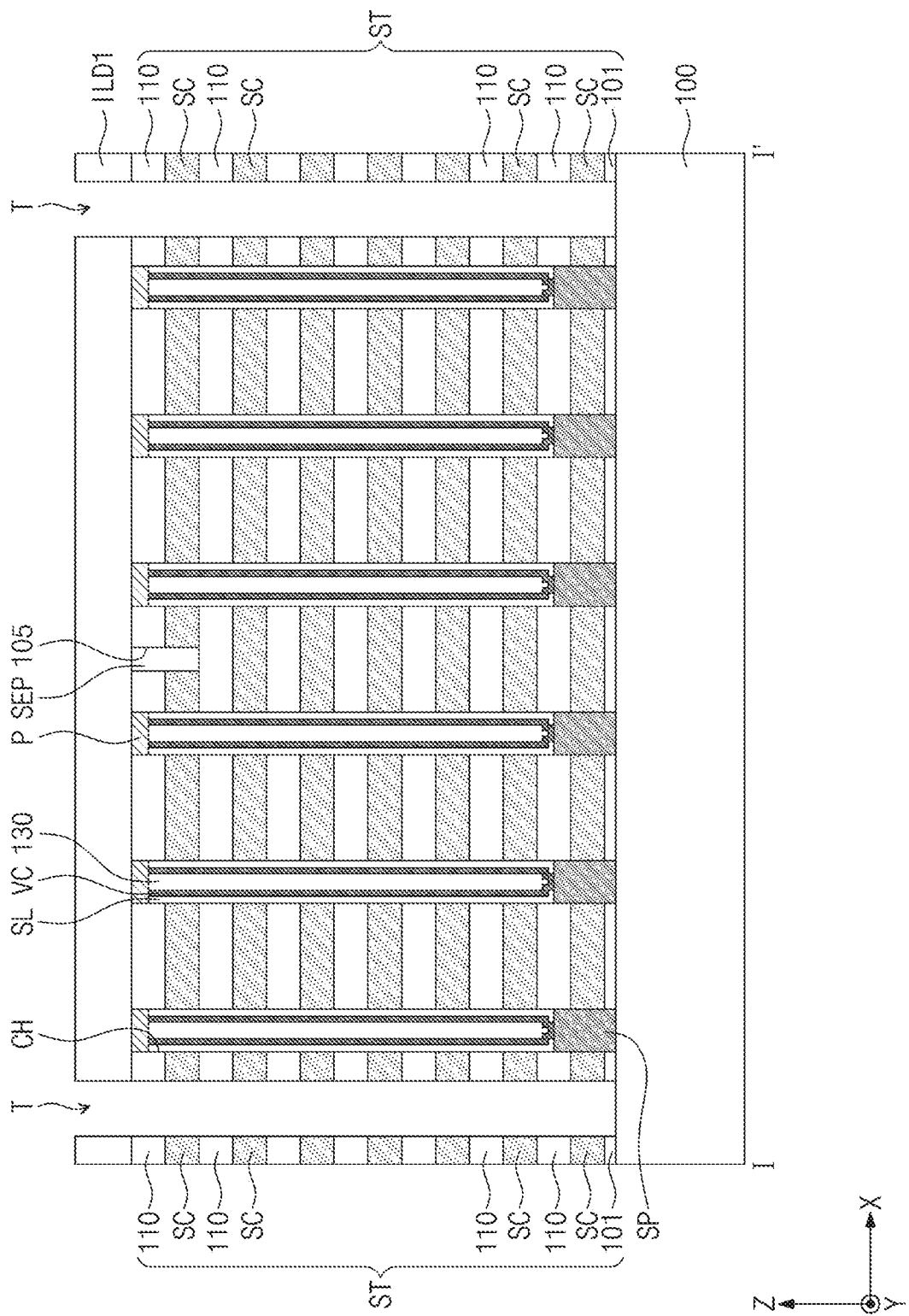
Figure 15C:
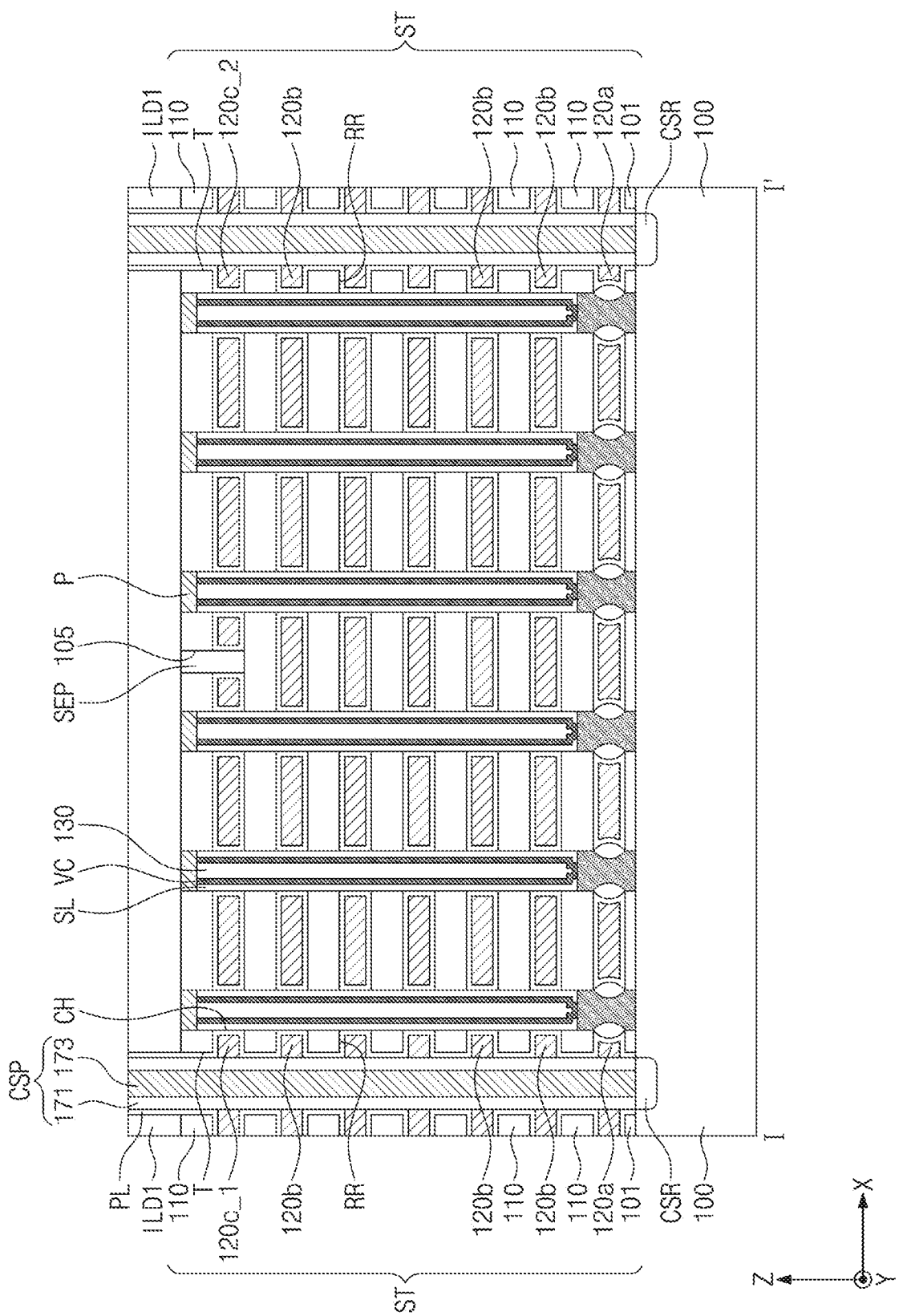

FIGS. 15A to 15C illustrate cross-sectional views taken along line I-I' of FIG. 3, showing a method of fabricating a three-dimensional semiconductor memory device according to some example embodiments of the present inventive concepts.

Referring to FIG. 15A, a mold structure MS may be formed on a substrate 100. The substrate 100 may be a silicon substrate, a silicon-germanium substrate, a germanium substrate, or a single crystalline epitaxial layer grown on a single crystalline silicon substrate.

The mold structure MS may include a buffer dielectric layer 101 on the substrate 100, and also include sacrificial layers 102 and dielectric layers 104 that are alternately and repeatedly stacked on the buffer dielectric layer 101. The sacrificial layers 102 may include a material having a different etch selectivity from that of the dielectric layers 104. For example, the sacrificial layers 102 may include a silicon nitride layer or a silicon oxynitride layer, and the dielectric layers 104 may include a silicon oxide layer.

An uppermost sacrificial layer 102 and an uppermost dielectric layer 104 may be patterned to form a separation trench 105 in the mold structure MS. The separation trench 105 may separate a single uppermost sacrificial layer 102 into pieces in a first direction X, and also separate a single uppermost dielectric layer 104 into pieces in the first direction X. The separation trench 105 may be formed by performing an anisotropic etching process (e.g., a dry etching process). A separation pattern SEP may be formed in the separation trench 105. The separation pattern SEP may be formed by forming a dielectric layer in the separation trench 105 and then performing a planarization process on the dielectric layer. The separation pattern SEP may extend in a second direction Y intersecting the first direction X. The separation pattern SEP may include, for example, a silicon oxide layer.

The mold structure MS may be etched to form channel holes CH that expose the substrate 100. For example, a mask pattern may be formed on the uppermost dielectric layer 104, and then an anisotropic etching process may be performed in which the mask pattern is used as an etching mask to anisotropically etch the mold structure MS. The anisotropic etching process may be performed to form the channel holes CH each having the same width along its height from the substrate 100. Alternatively, the anisotropic etching process may be performed to form the channel holes CH each having a variable width along its height from the substrate 100. For example, the channel holes CH may have their sidewalls inclined relative to the substrate 100. An over-etching action may be carried out such that the substrate 100 may be etched to have a recessed top surface. When viewed in a plan view, the channel holes CH may each have a circular shape, an elliptical shape, or a polygonal shape.

Semiconductor pillars SP may be formed in the channel holes CH. A selective epitaxial growth may be performed to grow the semiconductor pillar SP from the substrate 100 whose portion exposed to the channel hole CH is used as a seed. The semiconductor pillars SP may include a material having the same conductive type as that of the substrate 100, for example, an intrinsic semiconductor or a p-type conductive semiconductor.

Charge storage structures SL may be formed on sidewalls of the channel holes CH. The charge storage structures SL may cover the sidewall of the channel holes CH, and partially cover a top surface of the substrate 100 exposed to the channel holes CH. For example, the formation of the charge storage structures SL may include forming first, second, and third dielectric layers that sequentially cover inner walls of the channel holes CH, and performing a dry etching process to remove portions of the first to third dielectric layers to partially expose the top surface of the substrate 100.

Referring also to FIG. 5, each of the charge storage structures SL may include a blocking dielectric layer BKL, a charge storage layer TBL, and a tunnel dielectric layer TL that are sequentially formed on the sidewall of the channel hole CH. The blocking dielectric layer BKL may include, for example, a silicon oxide layer or a high-k dielectric layer (e.g., $Al_2O_3$ or $HfO_2$); the charge storage layer TBL may include, for example, a silicon nitride layer; and the tunnel dielectric layer TL may include, for example, a silicon oxynitride layer or a high-k dielectric layer (e.g., $Al_2O_3$ or $HfO_2$).

Vertical channels VC may be formed in the channel holes CH in which the charge storage structures SL are formed. The vertical channels VC may conformally cover inner walls of the tunnel dielectric layers TL and the top surface of the substrate 100 exposed by the charge storage structures SL. The vertical channels VC may include, for example, a semiconductor material. For example, the vertical channels VC may be one of a polycrystalline silicon layer, an organic semiconductor layer, and carbon nanostructures.

Gap-fill layers 130 may be formed in insides surrounded by the vertical channels VC in the channel holes CH. The gap-fill layers 130 may completely fill the channel holes CH. A spin-on glass (SOG) technique may be used to form the gap-fill layers 130. The gap-fill layers 130 may include a dielectric material, for example, one of a silicon oxide layer and a silicon nitride layer. Prior to the formation of the gap-fill layers 130, a hydrogen annealing process may be performed to anneal the vertical channels VC under a gas atmosphere including hydrogen or deuterium. The hydrogen annealing process may cure crystal defects present in the vertical channels VC.

Pads P may be formed on upper portions of the vertical channels VC, of the charge storage structures SL, and of the gap-fill layers 130. The pads P may be formed by etching upper portions of the charge storage structure SL, of the vertical channels VC, and of the gap-fill layers 130 to form recess regions, and then filling the recess regions with a conductive material. Alternatively, the pads P may be formed by doping the upper portions of the vertical channels VC with impurities whose conductive type is different from that of the vertical channels VC.

Referring to FIG. 15B, the mold structure MS may undergo an anisotropic etching process to form trenches T. The trenches T may be formed by forming a first interlayer dielectric layer ILD1 that covers a top surface of the mold structure MS, and performing an anisotropic etching process in which the first interlayer dielectric layer ILD1 is used as an etching mask to anisotropically etch the mold structure MS until the top surface of the substrate 100 is exposed. The trenches T may be formed to extend in the second direction Y. The trenches T may then be formed to have a linear or rectangular shape that extends in the second direction Y. The formation of the trenches T may form a plurality of stack structures ST that are disposed spaced apart from each other in the first direction X on the substrate 100.

Each of the stack structures ST may include the buffer dielectric layer 101, and also include sacrificial patterns SC and dielectric patterns 110 that are sequentially and alternately stacked on the buffer dielectric layer 101. The trenches T may expose sidewalls of the stack structure ST.

Referring to FIG. 15C, the sacrificial patterns SC exposed to the trenches T may be removed to form recess regions RR between the dielectric patterns 110 that are spaced apart in a third direction Z. The recess regions RR may be formed by performing a wet etching process and/or an isotropic dry etching process to remove the sacrificial patterns SC. Because the sacrificial patterns SC include a material having an etch selectivity with respect to the dielectric patterns 110, the dielectric patterns 110 may not be removed when the sacrificial patterns SC are removed. In addition, the separation pattern SEP may not be removed when the sacrificial patterns SC are removed. For example, when the sacrificial patterns SC include a silicon nitride layer, and when the dielectric patterns 110 and the separation pattern SEP include a silicon oxide layer, the etching process may be performed using an etchant including phosphoric acid.

The recess regions RR may horizontally extend from the trenches T into gaps between the dielectric patterns 110. The recess regions RR may expose top and bottom surfaces of the dielectric patterns 110, and also partially expose outer sidewalls of the charge storage structures SL. Gate dielectric layers 150 (FIG. 4) may be formed on sidewalls of the semiconductor pillars SP (FIG. 4) exposed to the recess regions RR. The gate dielectric layers 150 may include, for example, a thermal oxide layer or a silicon oxide layer.

A horizontal dielectric layer PL may be formed to cover surfaces of layers exposed to the recess regions RR and the trenches T. For example, the horizontal dielectric layer PL may be formed to conformally cover surfaces of the dielectric patterns 110, outer sidewalls of the charge storage structures SL exposed to the recess regions RR, and sidewalls of the gate dielectric layers 150. The horizontal dielectric layer PL may be formed by using a deposition process having excellent step coverage. For example, the horizontal dielectric layer PL may be formed by using chemical vapor deposition (CVD) or atomic layer deposition (ALD). The horizontal dielectric layer PL may include a silicon oxide layer (e.g., $SiO_2$) or a high-k dielectric layer (e.g., aluminum oxide ($Al_2O_3$) or hafnium oxide ($HfO_2$)).

The recess regions RR may be filled with a conductive material to form gate electrodes 120a, 120b, 120c_1, and 120c_2. The formation of the gate electrodes 120a, 120b, 120c_1, and 120c_2 may include forming a conductive layer to fill the recess regions RR, and then performing an etching process in which the conductive layer is removed from the trenches T, but remains locally in the recess regions RR. After the formation of the gate electrodes 120a, 120b, 120c_1, and 120c_2, common source regions CSR may be formed in the substrate 100 exposed to the trenches T. An ion implantation process may be performed to form the common source regions CSR. The common source regions CSR may have a conductive type different from that of the substrate 100.

Common source contact structures CSP may be formed in the trenches T. The common source contact structures CSP may include spacers 171 and common source contact plugs 173. The spacers 171 may cover sidewalls of the trenches T. The common source contact plugs 173 may fill insides surrounded by the spacers 171 in the trenches T. The spacers 171 may be formed to fill the trenches T with a dielectric material (e.g., a silicon oxide layer or a silicon nitride layer). The common source contact plugs 173 may include one or more of a conductive material (e.g., tungsten, copper, or aluminum) and metal nitride (e.g., titanium nitride or tantalum nitride).

Referring back to FIG. 4, a second interlayer dielectric layer ILD2 may be formed on the first interlayer dielectric layer ILD1. The second interlayer dielectric layer ILD2 may cover a top surface of the first interlayer dielectric layer ILD1 and top surfaces of the common source contact structures CSP. Cell contact plugs CCP (FIG. 4) may be formed to penetrate the first and second interlayer dielectric layers ILD1 and ILD2. The cell contact plugs CCP may be in direct contact with the pads P of the vertical structures VS. First, second, third, fourth, and fifth bit lines BL1, BL2, BL3, BL4, and BL5 may be formed on the second interlayer dielectric layer ILD2. The first to fifth bit lines BL1 to BL5 may be formed to extend in the first direction X and to have electrical connection with the cell contact plugs CCP.

According to some example embodiments of the present inventive concepts, third vertical structures may not be disposed linearly with first and fifth vertical structures, and centers of the third vertical structures may be disposed spaced apart in a fourth direction from a first reference line that passes through centers of the first and fifth vertical structures. Accordingly, neighboring first to fifth bit lines may have electrical connection, without electrical shorts therebetween, with first to fifth vertical structures that penetrate first and second string select gate electrodes so as to allow the first to fifth vertical structures that penetrate the first string select gate electrode to correspond to the first to fifth vertical structures that penetrate the second string select gate electrode.

According to some example embodiments of the present inventive concepts, when viewed in a plan view, the first to fifth bit lines may be slanted relative to a first direction. Accordingly, neighboring first to fifth bit lines may have electrical connection, without electrical shorts therebetween, with first to fifth vertical structures that penetrate first and second string select gate electrodes so as to allow the first to fifth vertical structures that penetrate the first string select gate electrode to correspond to the first to fifth vertical structures that penetrate the second string select gate electrode.

Although the present invention has been described in connection with some example embodiments of the present inventive concepts illustrated in the accompanying drawings, it will be understood by those skilled in the art that various substitutions, changes, and modifications may be made without departing from the scope of the present inventive concepts.

What is claimed is:

1. A three-dimensional semiconductor memory device comprising:
   a stack structure that is on a substrate and includes a plurality of gate electrodes;
   a first vertical structure, a second vertical structure, a third vertical structure, and a fourth vertical structure that penetrate the stack structure and are arranged in a zigzag shape comprising a sequence of the first vertical structure, the second vertical structure, the third vertical structure, and then the fourth vertical structure at different respective positions along a first direction; and
   a first bit line that extends in the first direction,
   wherein the first bit line vertically overlaps the second vertical structure and the fourth vertical structure, centers of the second and fourth vertical structures being spaced apart at the same distance from the first bit line,
   wherein the first vertical structure is spaced apart at a first distance from the first bit line,
   wherein the third vertical structure is spaced apart at a second distance from the first bit line,
   wherein a portion of the first vertical structure overlaps a portion of the third vertical structure in the first direction,
   wherein the first distance is greater than the second distance and is less than a distance between the portion of the first vertical structure and the portion of the third vertical structure,
   wherein the gate electrodes include a first string select gate electrode and a second string select gate electrode that are spaced apart in the first direction,
   wherein the first vertical structure, the second vertical structure, the third vertical structure, and the fourth vertical structure penetrate the first string select gate electrode, and
   wherein the three-dimensional semiconductor memory device further comprises a fifth vertical structure, a sixth vertical structure, a seventh vertical structure, and an eighth vertical structure that penetrate the second string select gate electrode and correspond to the first vertical structure, the second vertical structure, the third vertical structure, and the fourth vertical structure, respectively.

2. The three-dimensional semiconductor memory device of claim 1,
   wherein the first vertical structure, the second vertical structure, and the third vertical structure collectively define an inequilateral triangular shape, and
   wherein the second vertical structure, the third vertical structure, and the fourth vertical structure collectively define an inverted inequilateral triangular shape.

3. The three-dimensional semiconductor memory device of claim 1,
   wherein a first minimum distance between the first vertical structure and the second vertical structure is greater than a second minimum distance between the second vertical structure and the third vertical structure, and
   wherein a third minimum distance between the third vertical structure and the fourth vertical structure is equal to the second minimum distance.

4. The three-dimensional semiconductor memory device of claim 1, further comprising a ninth vertical structure spaced apart at the first distance from the first bit line,
wherein the third vertical structure is between, in the first direction, the first vertical structure and the ninth vertical structure.

5. The three-dimensional semiconductor memory device of claim 1, further comprising:
a separation pattern that is between the first string select gate electrode and the second string select gate electrode and extends in a second direction intersecting the first direction; and
a plurality of dummy vertical structures that penetrate the separation pattern and the stack structure.

6. The three-dimensional semiconductor memory device of claim 1, further comprising a second bit line, a third bit line, and a fourth bit line that are on the stack structure and extend in the first direction,
wherein the first bit line is connected to the fourth vertical structure,
wherein the second bit line is connected to the second vertical structure,
wherein the third bit line is connected to the third vertical structure; and
wherein the fourth bit line is connected to the first vertical structure.

7. The three-dimensional semiconductor memory device of claim 1,
wherein the stack structure comprises a first stack structure, and
wherein the three-dimensional semiconductor memory device further comprises:
a second stack structure that includes a second plurality of gate electrodes on the substrate and is spaced apart from the first stack structure in the first direction;
a through dielectric pattern that penetrates the first stack structure, the second stack structure, and the substrate;
a lower substrate;
a peripheral circuit structure that is between the lower substrate and the substrate and includes a transistor; and
a contact plug that penetrates the through dielectric pattern and is connected to the transistor.

8. A three-dimensional semiconductor memory device comprising:
a stack structure on a substrate, including a first string select line and a second string select line that are spaced apart in a first direction;
a plurality of first vertical structures and a plurality of second vertical structures that penetrate the first string select line and the second string select line, the first vertical structures being spaced apart in the first direction from the second vertical structures;
a plurality of third vertical structures that penetrate the first and second string select lines, the third vertical structures being spaced apart at a first distance from a line that passes through centers of the first and second vertical structures; and
a first bit line that extends across the stack structure,
wherein the first bit line connects one of the third vertical structures that penetrates the first string select line to one of the second vertical structures that penetrates the second string select line.

9. The three-dimensional semiconductor memory device of claim 8,
wherein a lateral surface of the stack structure is perpendicular to a top surface of the substrate, and
wherein when viewed in a plan view, sidewalls of the first bit line that extend across the lateral surface of the stack structure make an acute or obtuse angle with the lateral surface of the stack structure.

10. The three-dimensional semiconductor memory device of claim 8, further comprising:
a plurality of fourth vertical structures that penetrate the first and second string select lines, the fourth vertical structures being spaced apart at the first distance from the line; and
a plurality of fifth vertical structures that penetrate the first and second string select lines, the fifth vertical structures being spaced apart at the first distance from the line,
wherein the one of the third vertical structures is collinear with one of the fourth vertical structures and one of the fifth vertical structures along the first direction, and
wherein the one of the fourth vertical structures is between the one of the third vertical structures and the one of the fifth vertical structures.

11. The three-dimensional semiconductor memory device of claim 10,
wherein the one of the third vertical structures, one of the first vertical structures, and the one of the fourth vertical structures collectively define a triangular shape,
wherein the one of the first vertical structures, the one of the fourth vertical structures, and the one of the second vertical structures collectively define an inverted triangular shape, and
wherein the one of the fourth vertical structures, the one of the second vertical structures, and the one of the fifth vertical structures collectively define a triangular shape.

12. The three-dimensional semiconductor memory device of claim 8, further comprising:
a plurality of fourth vertical structures that penetrate the first and second string select lines;
a plurality of fifth vertical structures that penetrate the first and second string select lines; and
a second bit line, a third bit line, and a fourth bit line that extend across the stack structure in parallel to the first bit line and are slanted relative to the first direction,
wherein the second bit line connects one of the second vertical structures that penetrates the first string select line to one of the first vertical structures that penetrates the second string select line,
wherein the third bit line connects one of the fourth vertical structures that penetrates the first string select line to one of the third vertical structures that penetrates the second string select line, and
wherein the fourth bit line connects one of the fifth vertical structures that penetrates the first string select line to one of the fourth vertical structures that penetrates the second string select line.

13. The three-dimensional semiconductor memory device of claim 12, wherein the first bit line is between the second bit line and the third bit line that are spaced apart in a second direction intersecting the first direction.

14. The three-dimensional semiconductor memory device of claim 8, further comprising:
a separation pattern that is between the first string select line and the second string select line, the separation pattern extending in a second direction intersecting the first direction; and
a plurality of dummy vertical structures that penetrate the separation pattern and the stack structure.

15. The three-dimensional semiconductor memory device of claim 8,
- wherein the stack structure comprises a first stack structure,
- wherein the three-dimensional semiconductor memory device further comprises:
- a second stack structure that includes a plurality of gate electrodes on the substrate and is spaced apart from the first stack structure in the first direction;
- a through dielectric pattern that penetrates the first stack structure, the second stack structure, and the substrate;
- a lower substrate;
- a peripheral circuit structure that is between the lower substrate and the substrate and includes a transistor; and
- a contact plug that penetrates the through dielectric pattern and is connected to the transistor.

* * * * *